United States Patent
Shaykhattarov et al.

(10) Patent No.: US 10,460,051 B2
(45) Date of Patent: Oct. 29, 2019

(54) COMPUTATIONALLY-EFFICIENT MODELING OF VISCOUS FINGERING EFFECT FOR ENHANCED OIL RECOVERY (EOR) AGENT INJECTED AT MULTIPLE INJECTION CONCENTRATIONS

(71) Applicant: Schlumberger Technology Corporation, Sugar Land, TX (US)

(72) Inventors: Marat Shaykhattarov, Abingdon (GB); Marie Ann Giddins, Abingdon (GB); Matthew Szyndel, Abingdon (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 478 days.

(21) Appl. No.: 15/295,408

(22) Filed: Oct. 17, 2016

(65) Prior Publication Data

US 2018/0107768 A1    Apr. 19, 2018

(51) Int. Cl.
 *G06F 17/50* (2006.01)
 *G06F 17/13* (2006.01)
 *E21B 43/16* (2006.01)

(52) U.S. Cl.
 CPC ........ *G06F 17/5009* (2013.01); *E21B 43/162* (2013.01); *G06F 17/13* (2013.01)

(58) Field of Classification Search
 CPC ........... E21B 43/16; C09K 8/58; C09K 8/594; C09K 8/582
 See application file for complete search history.

(56) References Cited

U.S. PATENT DOCUMENTS

| | | | |
|---|---|---|---|
| 4,709,759 A * | 12/1987 | Bock | C08F 220/56 166/275 |
| 4,941,533 A * | 7/1990 | Buller | C09K 8/594 166/246 |
| 2006/0020438 A1 | 1/2006 | Huh et al. | |
| 2006/0224369 A1* | 10/2006 | Yang | E21B 43/16 703/10 |
| 2008/0142230 A1* | 6/2008 | Lau | C09K 8/582 166/401 |
| 2009/0050325 A1 | 2/2009 | Gray et al. | |
| 2011/0259598 A1 | 10/2011 | Hilliard et al. | |
| 2011/0306525 A1* | 12/2011 | Lighthelm | C09K 8/58 507/225 |
| 2014/0083693 A1 | 3/2014 | Frank | |

(Continued)

OTHER PUBLICATIONS

Shawket Ghedan, "Global Laboratory Experience. of C02-EOR Flooding", SPE 125581, Oct. 2009.*

(Continued)

*Primary Examiner* — Kandasamy Thangavelu
(74) *Attorney, Agent, or Firm* — Jaime A. Castano

(57) ABSTRACT

A method, apparatus, and program product model an Enhanced Oil Recovery (EOR) process in a subsurface volume by computer modeling a variable-concentration injection of an EOR agent in multiple grid blocks of a reservoir grid, where the variable-concentration injection includes an injection of the EOR agent at multiple injection concentrations. For a first grid block among the multiple grid blocks within which EOR agent is present, a viscous fingering effect is modeled by modifying a fluid mobility in the first grid block based at least in part upon the injection concentration of the EOR agent present in the first grid block.

20 Claims, 12 Drawing Sheets

(56) References Cited

U.S. PATENT DOCUMENTS

| | | | |
|---|---|---|---|
| 2014/0190699 A1* | 7/2014 | Fletcher | C09K 8/588 166/305.1 |
| 2014/0305649 A1 | 10/2014 | Tang et al. | |
| 2014/0345862 A1* | 11/2014 | Jerauld | C09K 8/588 166/275 |

OTHER PUBLICATIONS

Moissis, D., "Simulation of viscous fingering during miscible displacement in nonuniform porous media", A thesis submitted to Rice University, Apr. 1988.*

E. Koval, "A Method for Predicting the Performance of Unstable Miscible Displacement in Heterogeneous Media", Society of Petroleum Engineers Journal, Jun. 1963, pp. 145-154.

J. Fayers, "An Approximate Model With Physically Interpretable Parameters for Representing Miscible Viscous Fingering," SPE Reservoir Engineering, May 1988, pp. 551-558.

M. Todd, W. Longstaff, "The Development, Testing, and Application of a Numerical Simulator for Predicting Miscible Flood Performance," Journal of Petroleum Technology, Jul., 1972, pp. 874-882.

J. Crump, "Detailed Simulations of the Effects of Process Parameters on Adverse Mobility Ratio Displacements," SPE U.S. Department of Energy, 17337, 1988, pp. 187-199.

P. Bondor, G. Hirasaki, M. Tham, "Mathematical Simulation of Polymer Flooding in Complex Reservoirs," Society Petroleum Engineers Journal 3524, Oct., 1972, pp. 369-382.

K. Sorbie, "Polymer-improved Oil Recovery," Blackie, CRC Press, Inc., 1991.

J.W. Barker and F.J. Fayers, "Transport Coefficients for Compositional Simulation With Coarse Grids in Heterogeneous Media," SPE Advanced Technology Series, vol. 2, No. 2, 22591, 1994, pp. 103-112.

M.J. Bourgeois, S. Thibeau and J. Guo, "Modelling Resdival Oil Saturation in Miscible and Immiscible Gas Floods by Use of Alpha-Factors," SPE Europe/EAGE Annual Conference and Exhibition, Vienna, Austria, May 23-26, 2011, pp. 1-12.

International Search Report and Written Opinion for the equivalent International patent application PCT/US2017/056224 dated Jan. 26, 2018.

International Preliminary Report on Patentability for the equivalent International patent application PCT/US2017/056224 dated May 2, 2019.

* cited by examiner

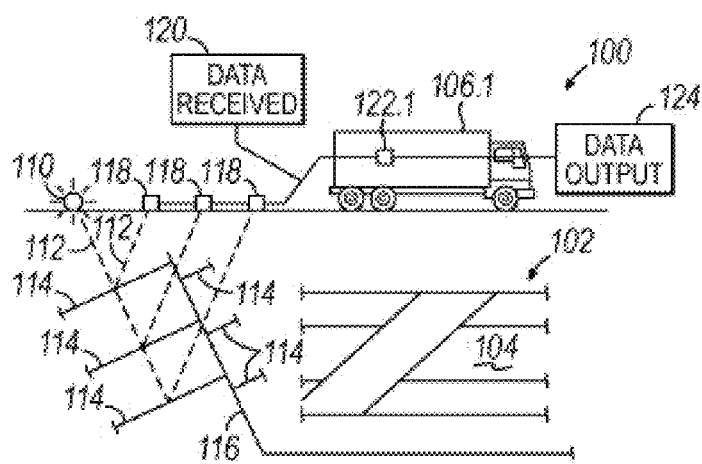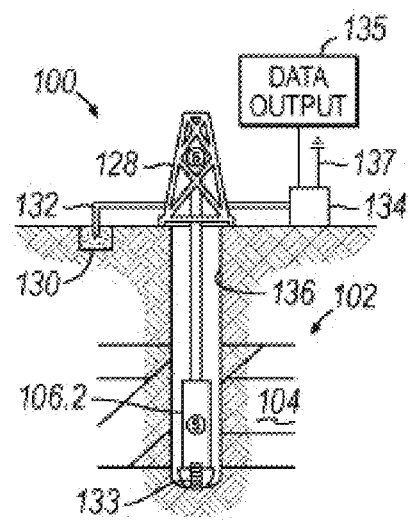
FIG. 2A  FIG. 2B
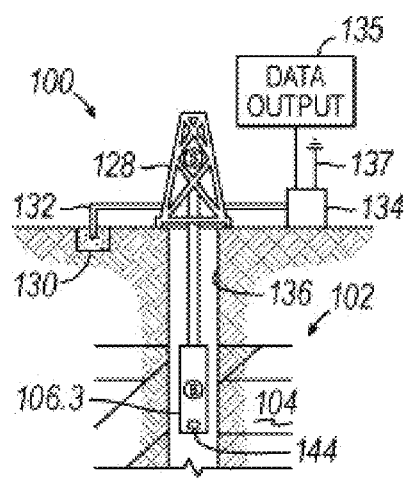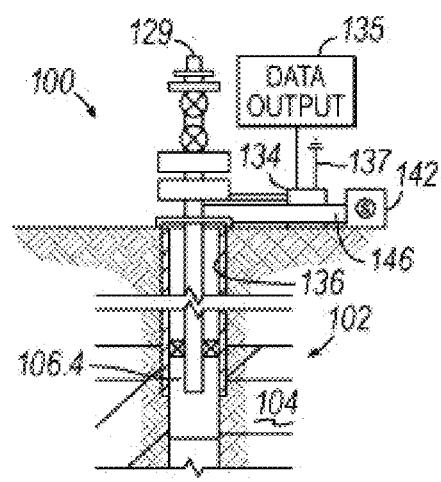
FIG. 2C  FIG. 2D

COMPUTATIONALLY-EFFICIENT MODELING OF VISCOUS FINGERING EFFECT FOR ENHANCED OIL RECOVERY (EOR) AGENT INJECTED AT MULTIPLE INJECTION CONCENTRATIONS

BACKGROUND

Traditional oil production processes, often referred to as primary and secondary recovery, may only be capable of recovering 20-40% of the reserves in an oilfield reservoir. As such, a demand has arisen for more advanced processes capable of extracting additional reserves from existing oilfield reservoirs.

As an example, chemical enhanced oil recovery (EOR) is a technique that attempts to increase recovery factor of a field by injecting various chemical agents, including polymers (collectively referred to herein as EOR agents), into a reservoir. For example, an EOR technique referred to as polymer flooding injects water viscosified with soluble polymers into a reservoir to increase viscosity such that the mobility of the injectant is less than that of the oil phase in place. Doing so can improve oil-recovery sweep efficiency by creating a substantially smooth flood front. In addition, in heterogeneous reservoirs, the viscous injectant may flow along high-permeability layers to decrease the flow rates within these layers and enhance sweep of zones with lower permeabilities.

In order to improve the economics of such EOR processes, some EOR techniques inject an EOR agent into a reservoir in the form of a slug, which is then followed by chase water, such that the chase water effectively pushes the EOR agent through the reservoir, thereby reducing the amount of EOR agent needed to perform an EOR process.

In the case of polymer flooding, as well as for other EOR agents, the mobility of the chase water is generally higher than the mobility of the displaced slug, which can cause a phenomenon referred to as viscous fingering to occur in the contact area between the slug and the chase water. Viscous fingering can reduce the efficiency of a sweep and can cause significant volumes of recoverable oil to be bypassed. In addition, in severe cases, an early breakthrough of water into adjacent production wellbores may also occur.

Selection of an optimal EOR technique, or combination of EOR techniques, for a particular oilfield reservoir is highly dependent upon the properties of the reservoir (e.g., temperature, pressure, salinity, oil composition, rock properties, etc.) as well as additional concerns such as economic factors (e.g., up front capital investment, current and/or projected oil prices, ongoing implementation costs, etc.) Software-based tools have been developed to automate and otherwise facilitate the selection of EOR processes and generate estimations of incremental recovery that may be expected from EOR processes for a given oilfield reservoir.

For example, reservoir simulation may be used in some instances to model and design EOR processes. However, accurate capturing of complex physical and chemical processes may be required in order to obtain reliable field performance forecast results, and viscous fingering is amongst such processes. Simulation grid resolution is generally known to have significant impact on accuracy of simulation results, which holds particularly true for unstable displacement processes such as viscous fingering due to the relatively small dimensions of the viscous fingers. At the level of resolution needed to accurately simulate viscous fingering, however, the time and/or computational resources needed to run a simulation may be impractical for many situations. Inaccurate results can lead to, for example, poor EOR process performance, and in some cases, unexpected water breakthrough.

Upscaling may be used in some approaches to model viscous fingering in a less computationally-intensive manner. Such approaches, however, are generally limited to modeling processes where EOR agent is injected at a single, constant injection concentration. However, in many real world applications the injection concentration of EOR agent may be varied during field development, and conventional approaches can lead to inaccurate and/or erroneous results.

Therefore, a significant need exists for improved computer-implemented techniques for accurate and computationally efficient modeling of viscous fingering associated with an EOR agent during a reservoir simulation of an EOR process.

SUMMARY

The embodiments disclosed herein provide in one aspect a method of modeling an Enhanced Oil Recovery (EOR) process in a subsurface volume by computer modeling a variable-concentration injection of an EOR agent in multiple grid blocks of a reservoir grid, where the variable-concentration injection includes an injection of the EOR agent at multiple injection concentrations. For a first grid block among the multiple grid blocks within which EOR agent is present, a viscous fingering effect may be modeled by modifying a fluid mobility in the first grid block based at least in part upon the injection concentration of the EOR agent present in the first grid block.

In some embodiments, the EOR agent present in the first grid block is injected at a first injection concentration, and modifying the fluid mobility in the first grid block based at least in part upon the injection concentration of the EOR agent present in the first grid block includes computing an effective mobility or an effective viscosity of the EOR agent present in the first grid block based at least in part on the first injection concentration. In addition, in some embodiments, the first grid block additionally includes EOR agent injected at a second injection concentration, and computer modeling the viscous fingering effect within the first grid block further modifies the fluid mobility in the first grid block based at least in part upon the second injection concentration.

Further, in some embodiments, computing the effective mobility or effective viscosity of the EOR agent disposed in the first grid block is performed for a first time period during which the EOR agent injected at the first injection concentration is disposed in the first grid block, computer modeling the viscous fingering effect includes computing a second effective mobility or effective viscosity of EOR agent disposed in the first grid block at the second time period and injected at a second injection concentration, and computing the second effective mobility or effective viscosity of the EOR agent disposed in the first grid block at the second time period includes computing the second effective mobility or effective viscosity using the second injection concentration.

Some embodiments also include computer modeling the viscous fingering effect within at least a subset of the grid blocks within which EOR agent injected at the multiple injection concentrations is present by modifying a fluid mobility in each of the at least a subset of the grid blocks based at least in part upon at which among the injection concentrations EOR agent present in such grid block has been injected. In some embodiments, the variable-concentration injection forms multiple EOR agent slugs having differing injection concentrations, computer modeling the variable-concentration injection in the grid blocks concurrently models the multiple EOR agent slugs, and computer modeling the viscous fingering effect within the at least a subset of the grid blocks concurrently models the viscous fingering effect for each of the EOR agent slugs.

In some embodiments, the EOR agent includes polymer, and in some embodiments, the grid blocks are defined at a spatial resolution that is insufficient to accurately model viscous fingers.

Some embodiments also include computer modeling the viscous fingering effect within at least a subset of the grid blocks within which EOR agent injected at the multiple concentrations is present by applying a transport coefficient function to enable fluid mobility in each of the at least a subset of grid blocks to be calculated for any of the injection concentrations. In some embodiments, the transport coefficient function is a function of a concentration of EOR agent present in a grid block, and applying the transport coefficient function includes applying the transport coefficient function for the first grid block based upon a concentration of EOR agent present in the first grid block. Further, some embodiments include generating the transport coefficient function by determining a mobility modifier over a range of EOR agent concentrations and over a range of EOR agent injection concentrations.

In some embodiments, computer modeling the variable-concentration injection of the EOR agent further includes computer modeling a substantially constant injection of a neutral component, where the transport coefficient function is additionally a function of a concentration of the neutral component present in a grid block, and applying the transport coefficient function further includes applying the transport coefficient function for the first grid block based upon a concentration of neutral component present in the first grid block. Some embodiments also include generating the transport coefficient function by determining a mobility modifier over a range of EOR agent concentrations and over a range of neutral component concentrations. In some embodiments, the transport coefficient function is implemented using a two-dimensional lookup table having first and second inputs respectively based on neutral component concentration and EOR agent concentration. In addition, in some embodiments computer modeling the viscous fingering effect within the first grid block includes computing a mobility modifier for the EOR agent using the transport coefficient function, and some embodiments also include computing an effective mobility of a water component disposed in the first grid block using the transport coefficient function.

In addition, in some embodiments, computer modeling the variable-concentration of the EOR agent includes computer modeling the variable-concentration injection of the EOR agent using multiple EOR agent components respectively modeling the EOR agent at respective injection concentrations, the EOR agent components include a first EOR agent component corresponding to the EOR agent injected at the first injection concentration, and computer modeling the viscous fingering effect within the first grid block includes using the injection concentration of the EOR agent as a maximum concentration in a calculation of effective viscosity or effective mobility for the first EOR agent component. Further, in some embodiments, the EOR agent components include a second EOR agent component corresponding to the EOR agent injected at a second injection concentration, and the method further includes using the second injection concentration of the EOR agent as a maximum concentration in a calculation of effective viscosity or effective mobility for the second EOR agent component.

Some embodiments may also include an apparatus including at least one processing unit and program code configured upon execution by the at least one processing unit to model an EOR process in any of the manners discussed herein. Some embodiments may also include a program product including a computer readable medium and program code stored on the computer readable medium and configured upon execution by at least one processing unit to model an EOR process in any of the manners discussed herein.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described example embodiments of the invention. This summary is merely provided to introduce a selection of concepts that are further described below in the detailed description, and is not intended to identify key or essential features of the claimed subject matter, nor is it intended to be used as an aid in limiting the scope of the claimed subject matter.

BRIEF DESCRIPTION OF THE DRAWINGS

FIGS. 2A-2D illustrate simplified, schematic views of an oilfield having subterranean formations containing reservoirs therein in accordance with implementations of various technologies and techniques described herein.

DETAILED DESCRIPTION

The herein-described embodiments may be used to model a viscous fingering effect associated with an Enhanced Oil Recovery (EOR) process such as a variable-concentration injection of polymer or another EOR agent in a subsurface volume. The variable-concentration injection may include multiple injection concentrations of one or more EOR agents, and the computer modeling may simulate viscous fingering effects associated with the variable-concentration injection over a simulation grid, and generally using a grid resolution that is too coarse to accurately model the physical structure of viscous fingers formed within a reservoir as one or more slugs of EOR agent move through the reservoir. Instead, an upscaling technique is used to model the effective viscosity and/or mobility of EOR agent(s) within grid blocks within the simulation grid based in part on the different injection concentrations of the EOR agent(s) to model viscous fingering effects in a manner that is more computationally efficient. As such, the herein-described techniques have a technical effect in terms of improving simulation performance from a computational standpoint, as will become more apparent from the discussion below. The herein-described techniques, may be used for a number of purposes, e.g., to assess the viscous fingering effect accurately in the case of varying EOR agent concentrations; to run multiple simulations using relatively computationally inexpensive simulation models using typical coarse grids; to determine optimum slug concentrations and sizes (injection times) resulting in optimum oil recovery by polymer flooding or other EOR agent processes; to minimize risks of severe viscous fingering and break-down of a slug (which will result in poor performance); and/or to minimize the amount of injected EOR agent, hence improving the economics of a project.

Hardware and Software Environment

Figure 1:
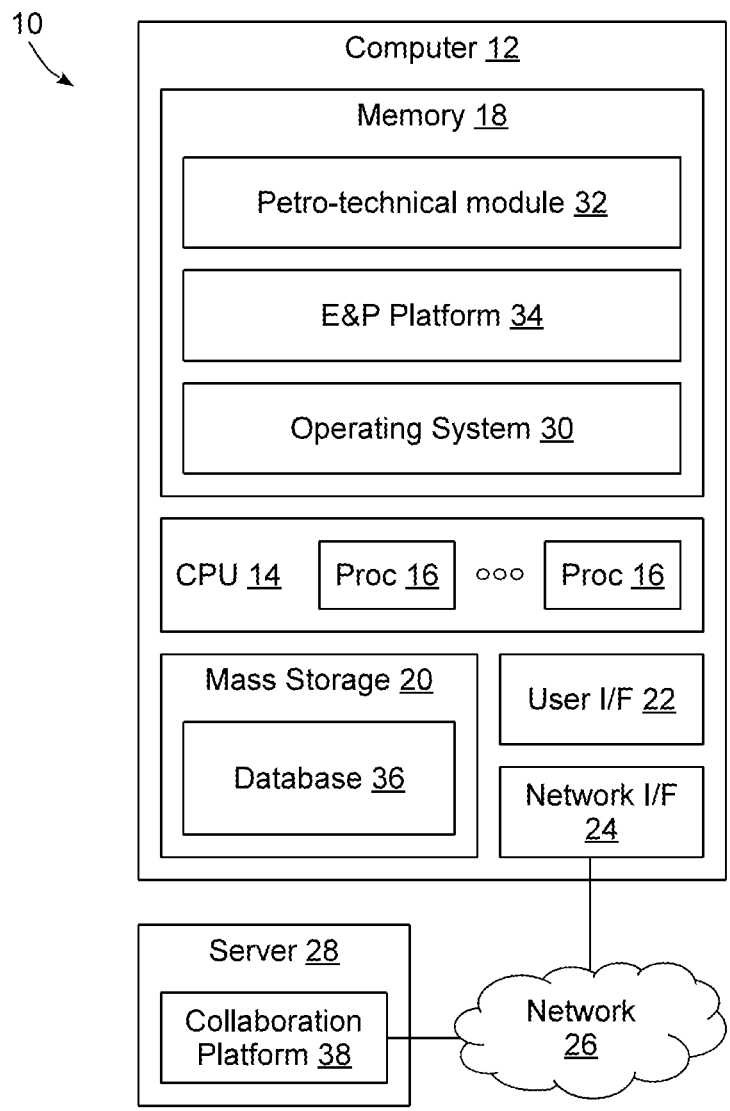
FIG. 1 is a block diagram of an example hardware and software environment for a data processing system in accordance with implementation of various technologies and techniques described herein.

Turning now to the drawings, wherein like numbers denote like parts throughout the several views, FIG. 1 illustrates an example data processing system 10 in which the various technologies and techniques described herein may be implemented. System 10 is illustrated as including one or more computers 12, e.g., client computers, each including a central processing unit (CPU) 14 including at least one hardware-based processor or processing core 16. CPU 14 is coupled to a memory 18, which may represent the random access memory (RAM) devices comprising the main storage of a computer 12, as well as any supplemental levels of memory, e.g., cache memories, non-volatile or backup memories (e.g., programmable or flash memories), read-only memories, etc. In addition, memory 18 may be considered to include memory storage physically located elsewhere in a computer 12, e.g., any cache memory in a microprocessor or processing core, as well as any storage capacity used as a virtual memory, e.g., as stored on a mass storage device 20 or on another computer coupled to a computer 12.

Each computer 12 also generally receives a number of inputs and outputs for communicating information externally. For interface with a user or operator, a computer 12 generally includes a user interface 22 incorporating one or more user input/output devices, e.g., a keyboard, a pointing device, a display, a printer, etc. Otherwise, user input may be received, e.g., over a network interface 24 coupled to a network 26, from one or more external computers, e.g., one or more servers 28 or other computers 12. A computer 12 also may be in communication with one or more mass storage devices 20, which may be, for example, internal hard disk storage devices, external hard disk storage devices, storage area network devices, etc.

A computer 12 generally operates under the control of an operating system 30 and executes or otherwise relies upon various computer software applications, components, programs, objects, modules, data structures, etc. For example, a petro-technical module or component 32 executing within an exploration and production (E&P) platform 34 may be used to access, process, generate, modify or otherwise utilize petro-technical data, e.g., as stored locally in a database 36 and/or accessible remotely from a collaboration platform 38. Collaboration platform 38 may be implemented using multiple servers 28 in some implementations, and it will be appreciated that each server 28 may incorporate a CPU, memory, and other hardware components similar to a computer 12.

In one non-limiting embodiment, for example, E&P platform 34 may implemented as the PETREL Exploration & Production (E&P) software platform, while collaboration platform 38 may be implemented as the STUDIO E&P KNOWLEDGE ENVIRONMENT platform, both of which are available from Schlumberger Ltd. and its affiliates. It will be appreciated, however, that the techniques discussed herein may be utilized in connection with other platforms and environments, so the invention is not limited to the particular software platforms and environments discussed herein.

It will also be appreciated that the functionality disclosed herein may be implemented using various computer architectures. For example, the functionality disclosed herein may be implemented using one or more stand-alone computers or programmable electronic devices, one or more server-based data processing systems, one or more networked data processing systems, one or more client-server data processing systems, one or more peer-to-peer data processing system, one or more cloud-based data processing systems, one or more distributed data processing systems, or combinations thereof.

In general, the routines executed to implement the embodiments disclosed herein, whether implemented as part of an operating system or a specific application, component, program, object, module or sequence of instructions, or even a subset thereof, will be referred to herein as "computer program code," or simply "program code." Program code generally comprises one or more instructions that are resident at various times in various memory and storage devices in a computer, and that, when read and executed by one or more hardware-based processing units in a computer (e.g., microprocessors, processing cores, or other hardware-based circuit logic), cause that computer to perform the steps embodying desired functionality. Moreover, while embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 10. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Furthermore, it will be appreciated by those of ordinary skill in the art having the benefit of the instant disclosure that the various operations described herein that may be performed by any program code, or performed in any routines, workflows, or the like, may be combined, split, reordered, omitted, and/or supplemented with other techniques known in the art, and therefore, the invention is not limited to the particular sequences of operations described herein.

Those skilled in the art will recognize that the example environment illustrated in FIG. 1 is not intended to limit the invention. Indeed, those skilled in the art will recognize that other alternative hardware and/or software environments may be used without departing from the scope of the invention.

Oilfield Operations

FIGS. 2A-2D illustrate simplified, schematic views of an oilfield 100 having subterranean formation 102 containing reservoir 104 therein in accordance with implementations of various technologies and techniques described herein. FIG. 2A illustrates a survey operation being performed by a survey tool, such as seismic truck 106.1, to measure properties of the subterranean formation. The survey operation is a seismic survey operation for producing sound vibrations. In FIG. 2A, one such sound vibration, sound vibration 112 generated by source 110, reflects off horizons 114 in earth formation 116. A set of sound vibrations is received by sensors, such as geophone-receivers 118, situated on the earth's surface. The data received 120 is provided as input data to a computer 122.1 of a seismic truck 106.1, and responsive to the input data, computer 122.1 generates seismic data output 124. This seismic data output may be stored, transmitted or further processed as desired, for example, by data reduction.

FIG. 2B illustrates a drilling operation being performed by drilling tools 106.2 suspended by rig 128 and advanced into subterranean formations 102 to form wellbore 136. Mud pit 130 is used to draw drilling mud into the drilling tools via flow line 132 for circulating drilling mud down through the drilling tools, then up wellbore 136 and back to the surface. The drilling mud may be filtered and returned to the mud pit. A circulating system may be used for storing, controlling, or filtering the flowing drilling muds. The drilling tools are advanced into subterranean formations 102 to reach reservoir 104. Each well may target one or more reservoirs. The drilling tools are adapted for measuring downhole properties using logging while drilling tools. The logging while drilling tools may also be adapted for taking core sample 133 as shown.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produces data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106.2 may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electromagnetic signal, which is representative of the measured drilling parameters. It will be appreciated by one of skill in the art that a variety of telemetry systems may be employed, such as wired drill pipe, electromagnetic or other known telemetry systems.

Generally, the wellbore is drilled according to a drilling plan that is established prior to drilling. The drilling plan sets forth equipment, pressures, trajectories and/or other parameters that define the drilling process for the wellsite. The drilling operation may then be performed according to the drilling plan. However, as information is gathered, the drilling operation may need to deviate from the drilling plan. Additionally, as drilling or other operations are performed, the subsurface conditions may change. The earth model may also need adjustment as new information is collected The data gathered by sensors (S) may be collected by surface unit 134 and/or other data collection sources for analysis or other processing. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller. In this manner, oilfield 100 may be selectively adjusted based on the data collected. This technique may be used to optimize portions of the field operation, such as controlling drilling, weight on bit, pump rates, or other parameters. These adjustments may be made automatically based on computer protocol, and/or manually by an operator. In some cases, well plans may be adjusted to select optimum operating conditions, or to avoid problems.

FIG. 2C illustrates a wireline operation being performed by wireline tool 106.3 suspended by rig 128 and into wellbore 136 of FIG. 2B. Wireline tool 106.3 is adapted for deployment into wellbore 136 for generating well logs, performing downhole tests and/or collecting samples. Wireline tool 106.3 may be used to provide another method and apparatus for performing a seismic survey operation. Wireline tool 106.3 may, for example, have an explosive, radioactive, electrical, or acoustic energy source 144 that sends and/or receives electrical signals to surrounding subterranean formations 102 and fluids therein.

Wireline tool 106.3 may be operatively connected to, for example, geophones 118 and a computer 122.1 of a seismic truck 106.1 of FIG. 2A. Wireline tool 106.3 may also provide data to surface unit 134. Surface unit 134 may collect data generated during the wireline operation and may produce data output 135 that may be stored or transmitted. Wireline tool 106.3 may be positioned at various depths in the wellbore 136 to provide a survey or other information relating to the subterranean formation 102.

Sensors (S), such as gauges, may be positioned about oilfield 100 to collect data relating to various field operations as described previously. As shown, sensor S is positioned in wireline tool 106.3 to measure downhole parameters which relate to, for example porosity, permeability, fluid composition and/or other parameters of the field operation.

FIG. 2D illustrates a production operation being performed by production tool 106.4 deployed from a production unit or Christmas tree 129 and into completed wellbore 136 for drawing fluid from the downhole reservoirs into surface facilities 142. The fluid flows from reservoir 104 through perforations in the casing (not shown) and into production tool 106.4 in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106.4 or associated equipment, such as christmas tree 129, gathering network 146, surface facility 142, and/or the production facility, to measure fluid parameters, such as fluid composition, flow rates, pressures, temperatures, and/or other parameters of the production operation.

Production may also include injection wells for added recovery. One or more gathering facilities may be operatively connected to one or more of the wellsites for selectively collecting downhole fluids from the wellsite(s).

While FIGS. 2B-2D illustrate tools used to measure properties of an oilfield, it will be appreciated that the tools may be used in connection with non-oilfield operations, such as gas fields, mines, aquifers, storage, or other subterranean facilities. Also, while certain data acquisition tools are depicted, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

The field configurations of FIGS. 2A-2D are intended to provide a brief description of an example of a field usable with oilfield application frameworks. Part, or all, of oilfield 100 may be on land, water, and/or sea. Also, while a single field measured at a single location is depicted, oilfield applications may be utilized with any combination of one or more oilfields, one or more processing facilities and one or more wellsites.

Figure 3:
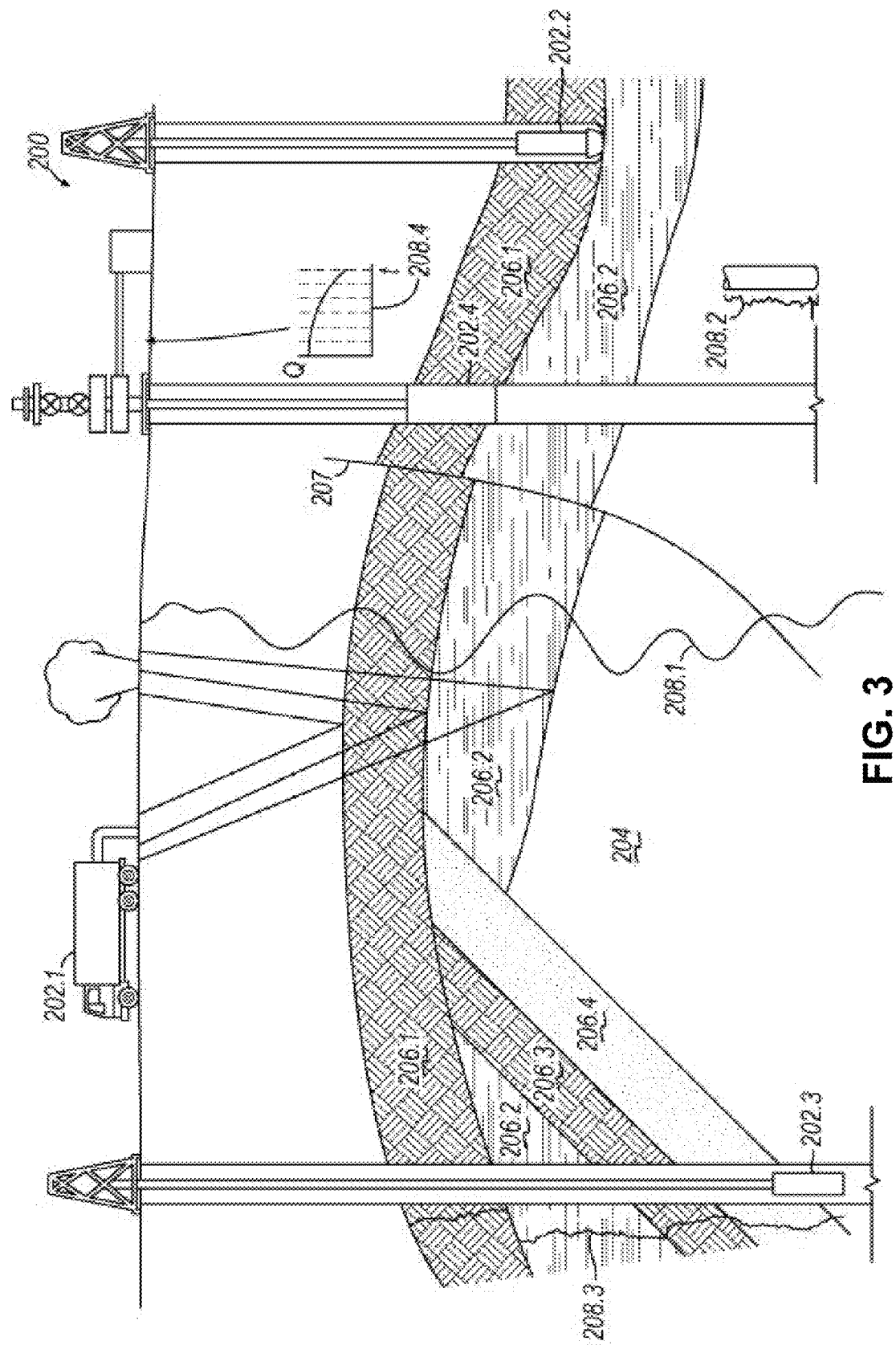
FIG. 3 illustrates a schematic view, partially in cross section of an oilfield having a plurality of data acquisition tools positioned at various locations along the oilfield for collecting data from the subterranean formations in accordance with implementations of various technologies and techniques described herein.

FIG. 3 illustrates a schematic view, partially in cross section of oilfield 200 having data acquisition tools 202.1, 202.2, 202.3 and 202.4 positioned at various locations along oilfield 200 for collecting data of subterranean formation 204 in accordance with implementations of various technologies and techniques described herein. Data acquisition tools 202.1-202.4 may be the same as data acquisition tools 106.1-106.4 of FIGS. 2A-2D, respectively, or others not depicted. As shown, data acquisition tools 202.1-202.4 generate data plots or measurements 208.1-208.4, respectively. These data plots are depicted along oilfield 200 to demonstrate the data generated by the various operations.

Data plots 208.1-208.3 are examples of static data plots that may be generated by data acquisition tools 202.1-202.3, respectively, however, it should be understood that data plots 208.1-208.3 may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208.1 is a seismic two-way response over a period of time. Static plot 208.2 is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208.3 is a logging trace that generally provides a resistivity or other measurement of the formation at various depths.

A production decline curve or graph 208.4 is a dynamic data plot of the fluid flow rate over time. The production decline curve generally provides the production rate as a function of time. As the fluid flows through the wellbore, measurements are taken of fluid properties, such as flow rates, pressures, composition, etc.

Other data may also be collected, such as historical data, user inputs, economic information, and/or other measurement data and other parameters of interest. As described below, the static and dynamic measurements may be analyzed and used to generate models of the subterranean formation to determine characteristics thereof. Similar measurements may also be used to measure changes in formation aspects over time.

The subterranean structure 204 has a plurality of geological formations 206.1-206.4. As shown, this structure has several formations or layers, including a shale layer 206.1, a carbonate layer 206.2, a shale layer 206.3 and a sand layer 206.4. A fault 207 extends through the shale layer 206.1 and the carbonate layer 206.2. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, generally below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 3, may then be processed and/or evaluated. Generally, seismic data displayed in static data plot 208.1 from data acquisition tool 202.1 is used by a geophysicist to determine characteristics of the subterranean formations and features. The core data shown in static plot 208.2 and/or log data from well log 208.3 are generally used by a geologist to determine various characteristics of the subterranean formation. The production data from graph 208.4 is generally used by the reservoir engineer to determine fluid flow reservoir characteristics. The data analyzed by the geologist, geophysicist and the reservoir engineer may be analyzed using modeling techniques.

Figure 4:
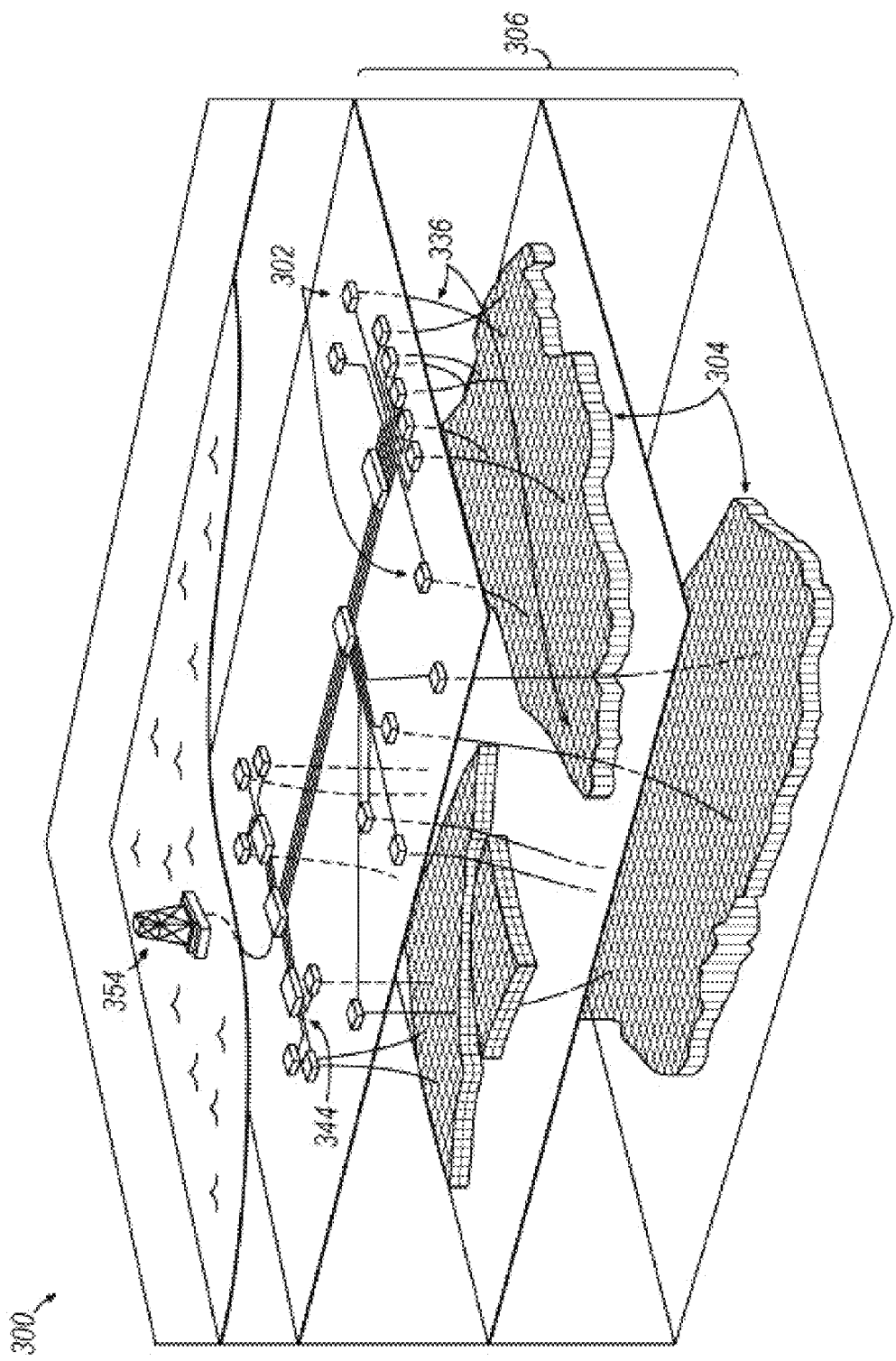
FIG. 4 illustrates a production system for performing one or more oilfield operations in accordance with implementations of various technologies and techniques described herein.

FIG. 4 illustrates an oilfield 300 for performing production operations in accordance with implementations of various technologies and techniques described herein. As shown, the oilfield has a plurality of wellsites 302 operatively connected to central processing facility 354. The oilfield configuration of FIG. 4 is not intended to limit the scope of the oilfield application system. Part or all of the oilfield may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores extend through subterranean formations 306 including reservoirs 304. These reservoirs 304 contain fluids, such as hydrocarbons. The wellsites draw fluid from the reservoirs and pass them to the processing facilities via surface networks 344. The surface networks 344 have tubing and control mechanisms for controlling the flow of fluids from the wellsite to processing facility 354.

Computationally-Efficient Modeling of Viscous Fingering Effect for Enhanced Oil Recovery (EOR) Agent Injected at Multiple Injection Concentrations Chemical enhanced oil recovery (EOR) is aimed to increase the recovery factor of an oil field by injecting various chemical agents, including polymers. Further, in order to improve the economics of EOR processes, chemicals are often injected in forms of slugs, which are then followed by chase water. In the case of polymer flooding, the mobility of the chase water is higher than the mobility of the displaced polymer slug, sometimes resulting in a phenomena referred to as viscous fingering occurring in the contact area between them.

Reservoir simulation is widely used to design EOR processes; however, accurate capturing of complex physical and chemical processes is sometimes needed in order to obtain reliable field performance forecast results, and viscous fingering is amongst such processes. Furthermore, grid resolution is generally understood to have an impact on the accuracy of simulation results, which holds particularly true for unstable displacement processes. However, for practical applications, upscaling techniques, sometimes based upon empirical models, may be used to capture fine scale phenomena while using relatively coarse grids, thus improving simulation accuracy in a more computationally-efficient manner than could be achieved through the use of a finer grid resolution.

Conventional approaches to addressing phenomena such as viscous fingering, however, have not appropriately accounted for the concentration dependent viscosity of polymer and other EOR agent solutions, which may have a direct impact on mixing calculations and which may make modelling of the viscous fingering effect more complex and less accurate.

Embodiments consistent with the invention, on the other hand, employ upscaling techniques to simulate the viscous fingering effect for polymer flooding or other EOR agent injection processes to enable the effect to be captured on coarse simulation grids, and generally without the need for using too fine and computationally expensive to simulate grids. Moreover, embodiments consistent with the invention may apply to processes using multiple EOR agent slugs of varied injection concentrations, as well as other unstable displacement processes with concentration dependent EOR agents, such as surfactant flooding.

Figure 5:
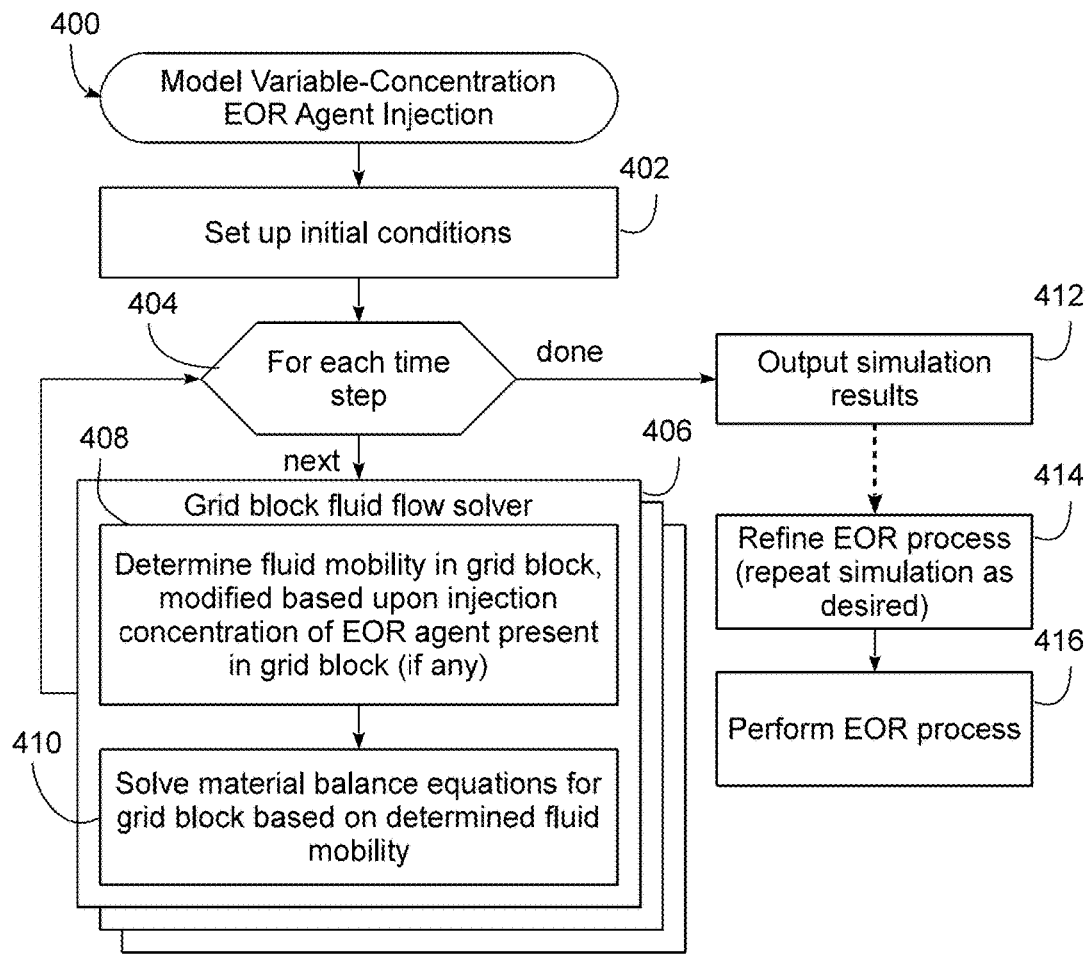
FIG. 5 is a flowchart illustrating an example sequence of operations for modeling a variable-concentration EOR agent injection in the data processing system of FIG. 1.

FIG. 5, for example, illustrates an example sequence of operations 400 for implementation in data processing system 10 (e.g., within one or more petro-technical modules 32, such as a reservoir simulator). In this sequence of operations, a variable-concentration injection of EOR agent is modeled first by setting up initial conditions for the simulation in block 402. The initial conditions may include, for example, input of a subsurface model, including one or more injection and/or production wells, a simulation grid comprising a plurality of grid blocks defined at a particular grid resolution, locations, quantities, compositions, injection concentrations, etc. of EOR agents to be injected, and other simulation inputs that will be appreciated by those of ordinary skill having the benefit of the instant disclosure.

Block 404 then initiates a multi-step fluid flow simulation to simulate the EOR agent injection process over a time frame. For example, during each time step, a plurality of grid block fluid flow solvers 406 may be executed to concurrently simulate fluid flow in the plurality of grid blocks for a single time step. As will be appreciated, simulation of fluid flow generally include solving material balance equations for each grid block, and generally based upon fluid volumes in grid blocks, fluid flow into and/or out of grid blocks, and fluid flow into and/or out of wells. Material balance equations are generally solved for oil, gas and aqueous phases, and in the case of EOR agent injection processes, injected EOR agents are considered to be components within one or more phases (e.g., the aqueous phase), and thus are solved in connection with solving for the phase(s) in each grid block.

It will be appreciated that the degree of parallelism employed in the simulation, e.g., the number of grid blocks processed in parallel and/or by different processors and/or processor nodes, may vary in different embodiments, and as such, the illustration of multiple fluid flow solvers 406 in FIG. 5 is merely an example, and other reservoir simulation architectures may be used in other embodiments. It will also be appreciated that blocks 406 may also communicate data between one another, e.g., to model fluid flow between different grid blocks.

Within each block 406, block 408 determines fluid mobility in a grid block, modified based upon an injection concentration of any EOR agent present in the grid block. In some embodiments, such a modification may be based upon the application of a mobility modifier to account for the viscous fingering effect within the grid block, the details of which will be discussed in greater detail below. Block 410 then solves the material balance equations for the grid block based in part on the determined fluid mobility as modified to account for viscous fingering in one or more of the grid blocks.

Returning to block 404, fluid flow is simulated over multiple time steps until the simulation is complete. At this time, control may pass to block 412 to store and output simulation results. Further, as illustrated in block 414 and 416, while potentially performed outside of sequence of operations 400, the simulation results may be used to refine the EOR process being simulated, e.g., to alter EOR agent concentrations, volumes, or other process variables in an attempt to improve the expected performance of the process, and in some instances, the simulation may be repeated one or more times until an acceptable process is achieved. As illustrated in block 416, an oilfield operation such as actually performing the EOR process may occur. In some instances, simulation results may be used to directly control oilfield equipment in connection with performing the EOR process. It will be appreciated that other oilfield operations may also be performed using the simulation results generated in sequence of operations 400.

Now turning to a more detailed explanation of the herein-described techniques, by way of introduction one conventional approach to modeling viscous fingering is referred to as the Todd-Longstaff model, which was originally developed for miscible gas processes and later adapted for polymer flooding. It will be appreciated, however, that other similar derived models also exist and could be used in cooperation with the herein-described techniques, however, so the invention is not limited as such.

The Todd-Longstaff model is generally used only in simple cases, where injected polymer concentration is kept constant, which usually holds true for lab experiments and pilot tests. However for more complex cases, e.g., where polymer concentration is varied during the field development, this model is generally not appropriate, and can lead to inaccurate results and predictions. It should be noted that in real field applications the use of varying concentrations is a likely scenario, as injected polymer concentration may be varied for the purpose of optimizing amounts of injected polymer, as well as reducing the viscous fingering effect in the back of a slug by gradually reducing concentrations, or due to other operational constraints.

With the aforementioned conventional approach, polymer is normally solved in a reservoir simulator as a component within the aqueous phase and it is modifying properties of the aqueous phase as a function of its local concentration. Therefore, the polymer component is modelled within the single aqueous phase.

With the viscous fingering effect, however, it may be assumed that polymer and water are present within a grid block partially as segregated from each other via viscous fingers. Viscosity within the grid blocks may be computed as an intermediate viscosity between fully mixed viscosity (i.e., no fingers) and viscosity of pure water or polymer. With the Todd-Longstaff model, aqueous phase and polymer component flows use different viscosities, and if adsorption, permeability reduction, and dead pore volume terms are ignored, the flow equations can be written as follows:

$$\frac{d}{dt}\left(\frac{VS_{aq}}{B_rB_{aq}}\right) = \sum\left[\frac{Tk_{r\,aq}}{B_{aq}\mu_{aq\,eff}}(\delta P_{aq}\ \rho_{aq}gD_z)\right] + Q_{aq} \quad (1)$$

$$\frac{d}{dt}\left(\frac{VS_{aq}C_p}{B_rB_{aq}}\right) = \sum\left[\frac{Tk_{r\,aq}}{B_{aq}\mu_{p\,eff}}(\delta P_{aq}\ \rho_{aq}gD_z)\right]C_p + Q_{aq}C_p \quad (2)$$

where: $\rho_{aq}$ is aqueous phase density, $\Sigma$ is sum over neighboring cells, $C_p$ is polymer concentration, $D_z$ is cell center depth, $B_r$, $B_{aq}$ are rock and aqueous phase formation volume factors, T is transmissibility, $k_{r\,aq}$ is aqueous phase relative permeability, $S_{aq}$ is aqueous phase saturation, V is block pore volume, $Q_{aq}$ is aqueous phase sink/source term through wells, $P_{aq}$ is aqueous phase pressure, and g is acceleration due to gravity.

Eqs. (1) and (2) are standard forms of material balance equations solved for each grid block at each time step of a simulation run, where the left hand side term represents an accumulation of phase volume (or component mass), the first term on the right hand side represents the sum of flows into and from other grid blocks, and the last term is the flow through wells. It will be appreciated that in other embodiments, other material balance equations may be used, and may include additional terms to accommodate absorption, desorption, permeability reduction, inaccessible pore volume, etc. In such cases proposed solutions may be modified accordingly to accommodate these additional terms.

Water and polymer viscosities may be calculated as:

$$\mu_{p,eff} = (\mu_m(C_p))^{\omega} \mu_p^{1-\omega} \quad (3)$$

$$\mu_{w,eff} = (\mu_m(C_p))^{\omega} \mu_w^{1-\omega} \quad (4)$$

$$\frac{1}{\mu_{aq,eff}} = \frac{1-\overline{C}}{\mu_{w,eff}} + \frac{1-\overline{C}}{\mu_{p,eff}} \quad (5)$$

$$\overline{C} = \frac{C_p}{C_{pmax}} \quad (6)$$

where $\mu_m(C_p)$ is "mixture viscosity" (i.e., viscosity of the polymer solution at average grid block polymer concentration assuming full mixing of polymer with water within grid blocks, in other words no viscous fingers), $\mu_w$ is viscosity of the pure water (without any polymer), $\mu_p$ is viscosity of the pure polymer solution (i.e., water containing polymer at injected concentration), $\mu_{w,eff}$ is "effective viscosity" of the water (i.e., viscosity of the water within grid blocks assuming that it is represented as water partially segregated from polymer solution (in the form of fingers) and partially mixed with it), $\mu_{p,eff}$ is "effective viscosity" of the polymer solution, $\omega$ is empirical mixing parameter (which is generally constant and determined experimentally), $\mu_{aq,eff}$ is effective viscosity of the aqueous phase (i.e., the total water in the grid block including the one with polymer after applying mixing calculations), $\overline{C}$ is normalized polymer concentration, $C_p$ is polymer cell concentration, and $C_{pmax}$ is maximum polymer concentration (i.e., the injection concentration of the polymer slug).

As per Eqs. (1) and (2), reservoir simulators generally solve equations for the aqueous phase and polymer components, and different types of water (with and without polymer) are generally not solved for explicitly. Therefore term "effective viscosity" of the aqueous phase is generally used, which is derived from the fact that the flow of the aqueous phase can be represented as a sum of flows of pure water and pure polymer solution.

In order to apply mixing calculations, injected polymer concentration generally is specified, $C_{pmax}$. For such calculations, any assumption that polymer and water components are fully mixed within the grid block is no longer valid, and as such, the concept of polymer saturation may be introduced. Normalized polymer concentration therefore may be used to represent polymer saturation.

Figure 6A:
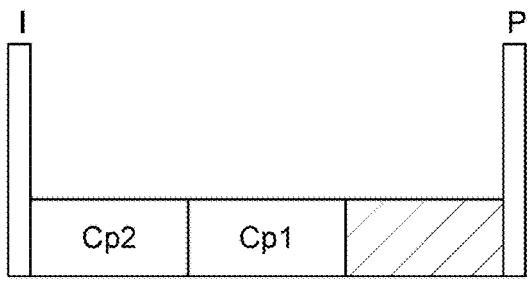
FIGS. 6A and 6B functionally illustrate the movement of two polymer slugs of different injection concentrations between an injection well and a production well.
Figure 6B:
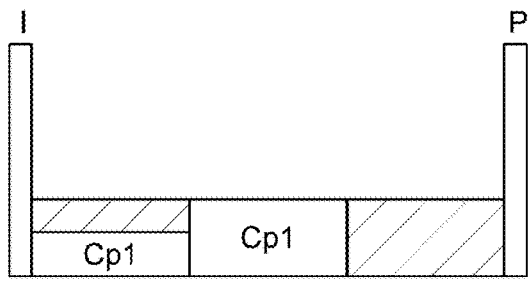

The conventional approach is limited, however, by the fact that $C_{pmax}$ is a single static parameter, and a slug of only one concentration can be modelled at once. If, for example, two slugs of different concentrations are attempted to be simulated with single value of $C_{pmax}$, unphysical results will be obtained, including erroneous results such as significant differences in polymer breakthrough times, as well as differences in the shape of the polymer production profile in general. This limitation can be visualized in conceptual way. FIGS. 6A and 6B, for example, depict a cross-section of a reservoir with an injector well I on the left and a producer well P on the right. Suppose that a polymer slug of higher concentration of $C_{p1}$ is injected first, followed by a polymer slug of lower concentration $C_{p2}$. For simplicity, dispersive smearing as well as viscous fingering between the different fluids is not visualized.

Polymer is aqueous phase solution, therefore it occupies all of the aqueous phase with its own certain concentration. When concentration is reduced, one would expect the polymer solution to still occupy all of the aqueous phase, but with lower concentration, as represented by FIG. 6A. However, with the conventional approach the second slug will behave in the same manner as the first one, but now will occupy only part of the aqueous phase, as illustrated in FIG. 6B. This situation can be thought of as a multiphase injector situation, where the polymer solution is injected along with segregated water, which is an unrealistic scenario as polymer in practice always will be injected as a homogeneous phase.

Embodiments consistent with the invention, on the other hand, address the limitations of the conventional approach by using the injection concentration of a polymer or other EOR agent to modify fluid mobility in a grid block during reservoir simulation of a variable-concentration injection of EOR agent. Doing so models viscous fingering effects in an accurate and computationally efficient manner.

Two techniques for modifying fluid mobility based on EOR agent injection concentration are disclosed hereinafter, one of which employs the use of transport coefficient functions and the other of which employs the use of multiple injection concentration-dependent EOR agent components. Each of these techniques will be discussed in greater detail hereinafter, and it will be appreciated that other techniques may be used and will be apparent to those of ordinary skill having the benefit of the instant disclosure. Furthermore, these techniques are described specifically in the context of polymer flooding, i.e., where the EOR agent is a polymer solution. It will be appreciated however, that the techniques may be used in other applications and in connection with other EOR agents, so the invention is not so limited. Further, application of these techniques to other applications and/or EOR agents will be within the abilities of those of ordinary skill having the benefit of the instant disclosure.

Transport Coefficient Functions

In some embodiments, the impact of the viscous fingering effect on EOR agent transport can be expressed in the form of transport coefficient functions, which may also be referred to as alpha-factors, and similar to the alpha-factors used in compositional simulation to match the breakthrough time of certain components by slowing them down to account to the fact that they can move too fast in coarse grid simulations due to the numerical dispersion effect.

In this case transport coefficients can be defined as ratios of viscosity at simulation grid cell polymer concentration to effective polymer or water viscosities. As both water and polymer component viscosities are functions of polymer concentration according to Eqs. (3)-(6), the transport coefficient function will also be a function of polymer concentration only. In this form, a transport coefficient function can be thought of as factors by which each component is being sped up or slowed down as a function of its own or other component concentration.

$$TC_p(C_p, C_{pmax}) = \frac{\mu_m(C_p)}{\mu_{p,eff}(C_p, C_{pmax})} \quad (7)$$

$$TC_{aq}(C_p, C_{pmax}) = \frac{\mu_m(C_p)}{\mu_{aq,eff}(C_p, C_{pmax})} \quad (8)$$

Terms $\mu_{p,eff}$ and $\mu_{aq,eff}$ according to Eqs. (3) to (5) are functions of polymer concentration in grid blocks (through term $\mu_m(C_p)$), as well as the injected polymer concentration, or maximum polymer concentration, $C_{pmax}$. For the polymer component, viscosity of the pure polymer solution $\mu_p$ is evaluated at polymer concentration $C_{pmax}$. Mixing parameter $\omega$ is assumed to be constant for all polymer slugs, and therefore is not considered as a variable in Eqs. (7) and (8).

The flow equations of the water and polymer can now be expressed using transport coefficients:

$$\frac{d}{dt}\left(\frac{VS_{aq}}{B_r B_{aq}}\right) = \sum \left[TC_{aq} \frac{Tk_{raq}}{B_{aq}\mu_m(C_p)} (\delta P_{aq} \quad \rho_{aq}gD_z)\right] + Q_{aq} \quad (9)$$

$$\frac{d}{dt}\left(\frac{VS_{aq}C_p}{B_r B_{aq}}\right) = \sum \left[TC_p \frac{Tk_{raq}}{B_{aq}\mu_m(C_p)} (\delta P_{aq} \quad \rho_{aq}gD_z)\right]C_p + Q_{aq}C_p \quad (10)$$

In order to generate transport coefficient functions, a range of polymer concentrations from 0 until injected concentration may be defined, and using a polymer solution viscosity vs. polymer concentration function ($\mu_m(C_p)$), which is an input function into the reservoir simulator, mixture viscosities for given concentrations may be determined. Then, an empirical equation accounting for the viscous fingering effect may be defined, e.g., the Todd-Longstaff equation, its variations or other equations that will be known to those of ordinary skill having the benefit of the instant disclosure.

Empirical constants (for example, ω) may be specified, along with any additional input relevant to the particular equation. For example, in the case of the Todd-Longstaff equation, pure water (without any polymer, $\mu_w=\mu_m(C_p=0)$) viscosity and viscosity of the polymer solution at injected concentration ($\mu_p=\mu_m(C_p=C_{pmax})$) may be specified. Then, effective viscosities or mobilities for a given range of polymer concentrations may be determined, e.g., using Eqs. (3)-(6) in the case of the Todd-Longstaff equation. Thereafter, Eqs. (7) and (8) may be used to determine the transport coefficient functions.

In some embodiments, the aforementioned calculations may be performed externally from the reservoir simulator (for example, in a spreadsheet) and the calculated function may be supplied to the simulator. In some other embodiments, such calculations may be performed internally in the simulator, given the fact that some information to calculate the transport coefficient functions is already being used in the simulator (e.g., polymer injection concentration, polymer mixture viscosity vs polymer concentration), some information can be additionally supplied (e.g., the mixing parameter, given that mixing equations are implemented in the simulator) and some information can be reasonably assumed (e.g., spacing to determine number of polymer concentration values).

Figure 7A:
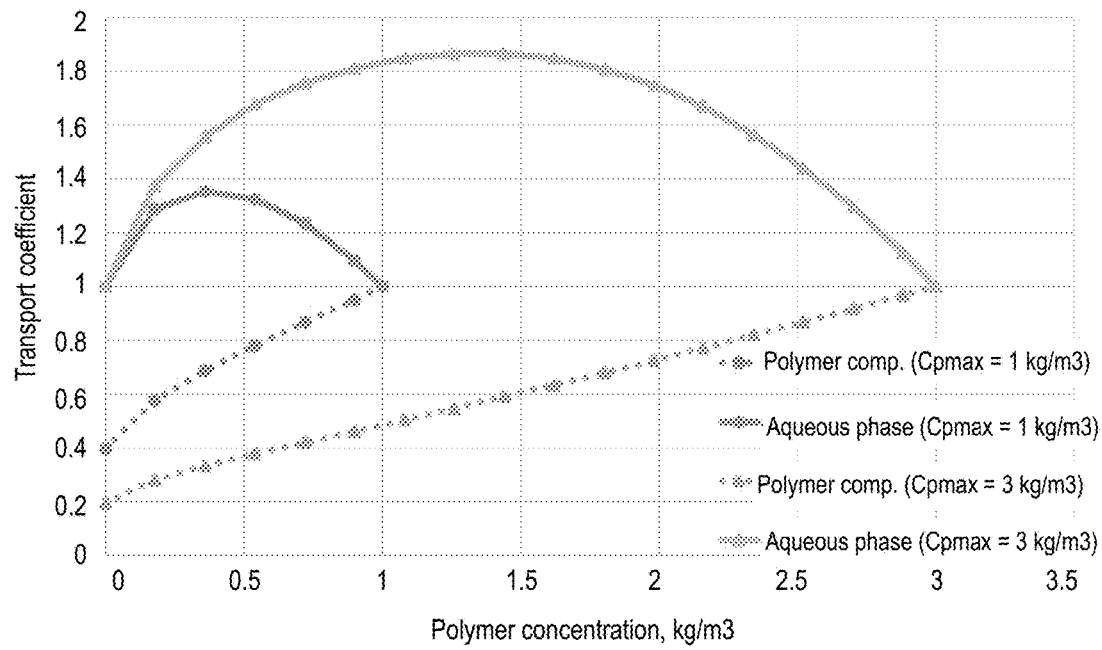
FIG. 7A illustrates example aqueous phase and polymer component transport coefficient functions for polymer slugs of different concentrations.

FIG. 7A illustrates representative transport coefficient functions for an aqueous phase and polymer component as determined in the manner discussed above and for different injection concentrations. It can be seen that at polymer injection concentration ($C_{pmax}$) both transport coefficients equal 1, meaning that aqueous phase and polymer component are moving at the same speed. As injected polymer concentration might vary, however, the transport coefficient functions for each injection concentration scenario will have a different range. Also, the concentration of the polymer solution will generally impact mobility ratio between water and polymer solutions, and the bigger the difference is, a higher magnitude of difference between the aqueous phase and polymer component transport coefficient functions will be obtained. Another way of representing the plots from FIG. 7A is shown in FIG. 7B, where ratios of polymer transport coefficient to aqueous phase transport coefficient are represented.

Figure 7B:
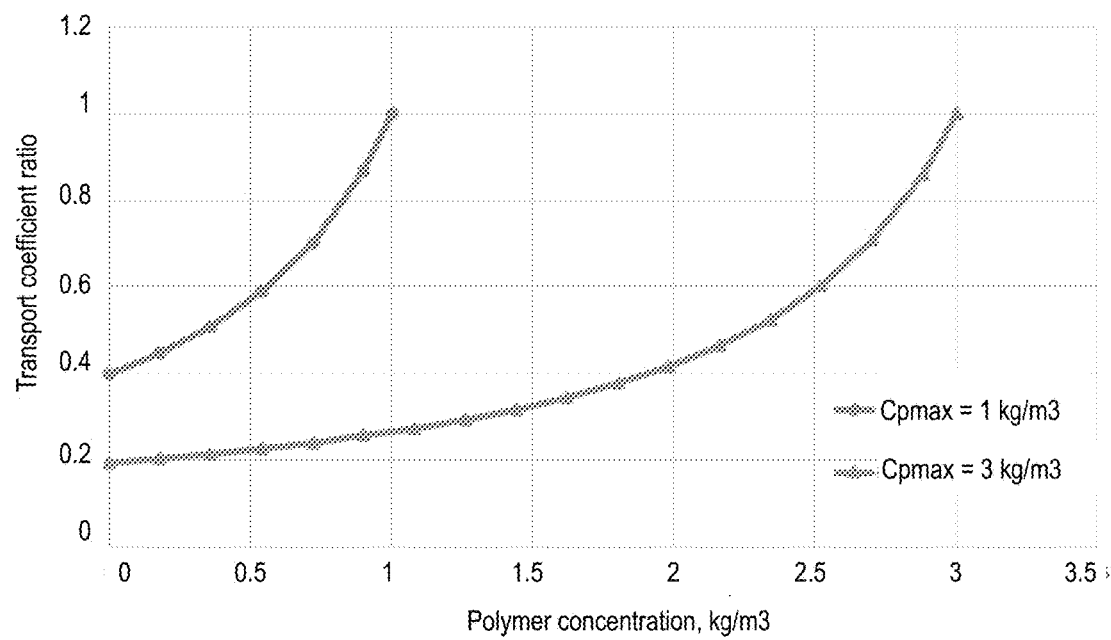
FIG. 7B illustrates example ratios of aqueous phase and polymer component transport coefficient functions for polymer slugs of different concentrations and corresponding to the transport coefficient functions of FIG. 7A.
Figure 8A:
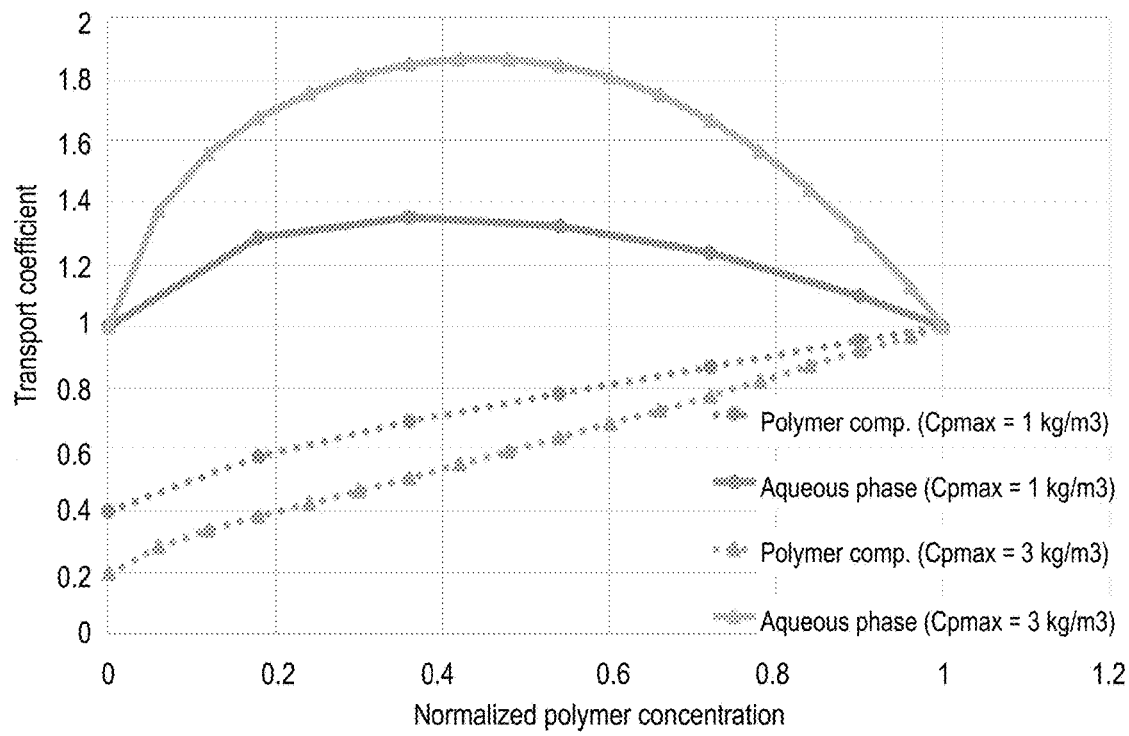
FIG. 8A illustrates example normalized aqueous phase and polymer component transport coefficient functions corresponding to the transport coefficient functions of FIG. 7A.
Figure 8B:
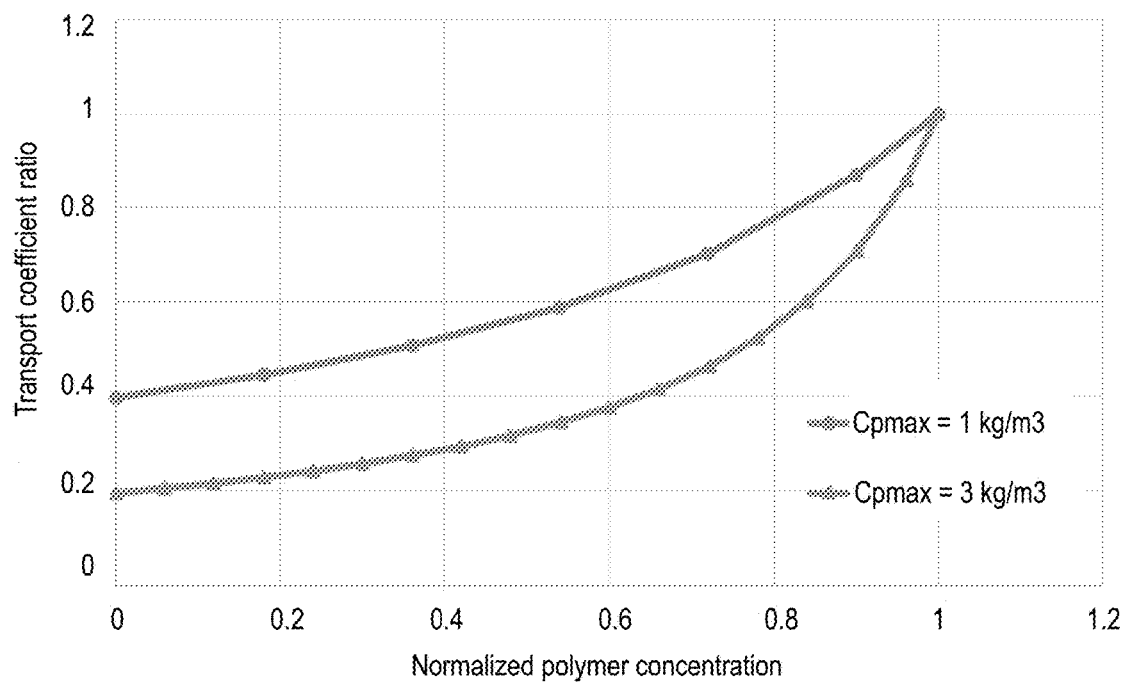
FIG. 8B illustrates example normalized ratios of aqueous phase and polymer component transport coefficient functions for polymer slugs of different concentrations and corresponding to the transport coefficient functions of FIG. 7A.

It can be seen from FIGS. 7A and 7B that a single function for the polymer component generally cannot be defined, as it will have to change once injected polymer concentrations are altered. However, if the plot is normalized, i.e., in the X axis, using the ratio of polymer concentration to its maximum concentration, the transport coefficient functions in the different injection concentration scenarios may be made to converge to single point, regardless of injected polymer concentration, as shown in FIGS. 8A and 8B.

Figure 9:
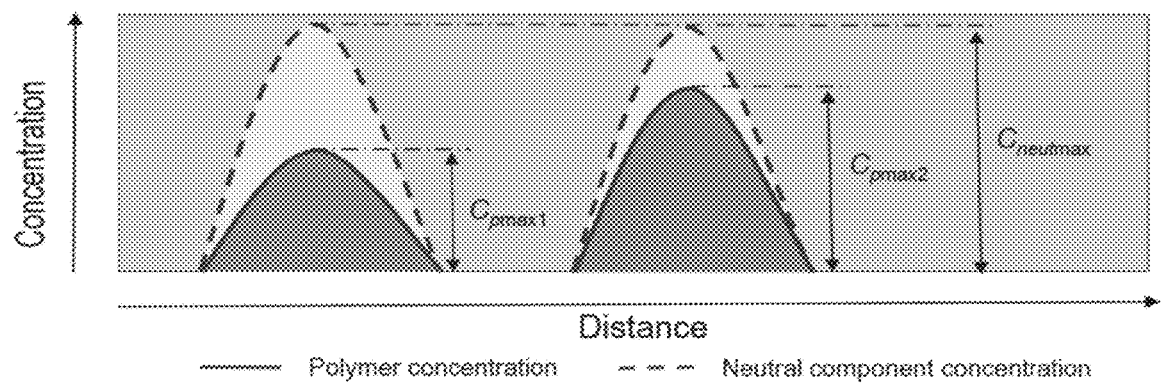
FIG. 9 is a conceptual representation of a system with polymer slugs of different concentrations and one neutral component.

Normalization may be implemented in some embodiments therefore to model polymer slugs of varying concentration. Polymer transport may be modified as a function not its own concentration, but rather the concentration of a neutral component, e.g., a numerical tracer, which may be "injected" in the simulation along with each polymer slug, and with its concentration kept constant to serve as a reference point against which each polymer slug can be compared, e.g., as shown in FIG. 9. Local maximum polymer concentrations indicated on the figure are effectively used through the implementation of the transport coefficient functions.

Figure 10:
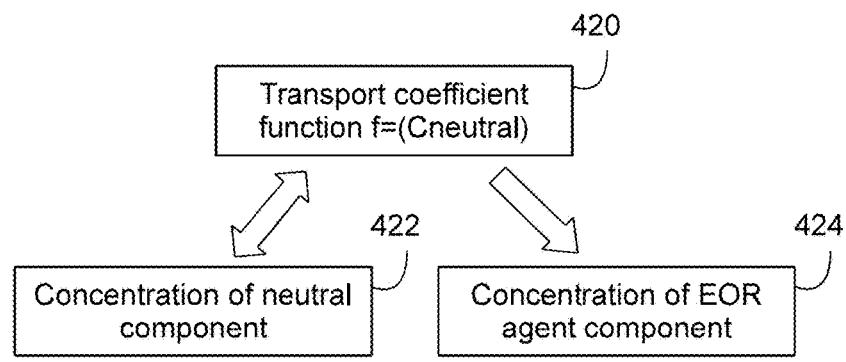
FIG. 10 is a schematic representation of the system of FIG. 9 and using a single transport coefficient function.

Once a transport coefficient function is defined, effective viscosity or mobility become functions of local concentration only (i.e., concentration of fluid present in a grid block), and the dependence on the actual viscosity of solutions is removed for the transport of components (i.e., this dependence is already incorporated within transport coefficient functions themselves). Therefore, a transport coefficient function may be defined for the neutral component only, and the transport of the neutral component modified by this function, which may then be transported in the same way as the polymer solution. The polymer component in each slug, in turn, will therefore also track the neutral component and with its transport modified accordingly. Schematically, this relationship is illustrated by block 420, 422 and 424 of FIG. 10.

In terms of equations, the transport coefficient function based on neutral component concentration may be defined as:

$$TC_{neutp}(C_{neut}, C_{neutmax}) = \frac{\mu_m(C_{neut})}{\mu_{p,eff}(C_{neut}, C_{neutmax})} \quad (11)$$

$$TC_{neutaq}(C_{neut}, C_{neutmax}) = \frac{\mu_m(C_{neut})}{\mu_{aq,eff}(C_{neut}, C_{neutmax})} \quad (12)$$

In addition, by using the assumption that:

$$\frac{C_{neut}}{C_{neutmax}} = \frac{C_{p1}}{C_{p1max}} + + \frac{C_{pn}}{C_{pnmax}} \quad (13)$$

the average $C_{pmax}$ in the grid cell may be calculated using the relationship $$C_{pmax} = C_p \frac{C_{neutmax}}{C_{neut}}$$

given that $C_p$ represents the sum of all polymer concentrations from different slugs. Water phase, polymer, and neutral component flow can therefore be written according Eqs. (14)-(16), as follows.

Water Phase Flow:

$$\frac{d}{dt}\left(\frac{VS_{aq}}{B_r B_{aq}}\right) = \sum \left[TC_{neutaq} \frac{Tk_{raq}}{B_{aq}\mu_m(C_p)} (\delta P_{aq} \quad \rho_{aq}gD_z)\right] + Q_{aq} \quad (14)$$

Polymer Component Flow:

$$\frac{d}{dt}\left(\frac{VS_{aq}C_p}{B_r B_{aq}}\right) = \sum \left[TC_{neutp} \frac{Tk_{raq}}{B_{aq}\mu_m(C_p)} (\delta P_{aq} \quad \rho_{aq}gD_z)\right]C_p + Q_{aq}C_p \quad (15)$$

Neutral Component Flow:

$$\frac{d}{dt} = \sum \left[TC_{neutp} \frac{Tk_{raq}}{B_{aq}\mu_m(C_p)} (\delta P_{aq} \quad \rho_{aq}gD_z)\right]C_{neut} + Q_{aq}C_{neut} \quad (16)$$

Figure 12:
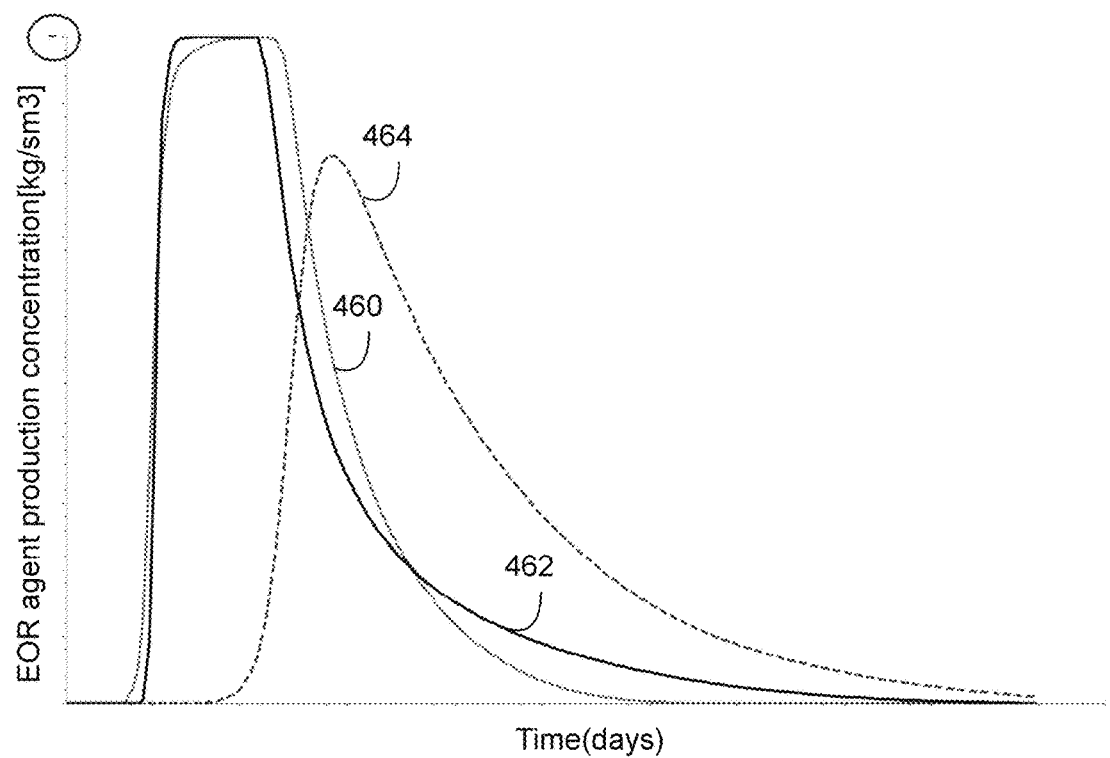
FIG. 12 compares polymer production profiles for polymer slugs generated using various techniques.

FIG. 12, for example, illustrates example results of such an implementation. As mentioned previously, at this point for the neutral component the transport coefficient function may be assumed for a particular single slug and applied to polymer components in all the slugs in the system. For this example, two slugs were used, one with a concentration of (3 kg/m3) and one with a concentration of (1 kg/m3). The higher concentration slug was used to generate the transport coefficient functions, and while not shown, the polymer production profile for the higher concentration slug will generally match that of the Todd-Longstaff model using mixing equations and assuming a single injection concentration of 3 kg/m3. FIG. 12 in turn illustrates a plot 460 for the lower concentration slug (1 kg/m3), along with a plot 462 corresponding to a Todd-Longstaff model using mixing equations and assuming a single injection concentration of 1 kg/m3, and showing a relatively close match therebetween. In contrast, plot 464 illustrates a transport coefficient as a function of polymer concentration, which provides appreciably poorer results.

Figure 13:
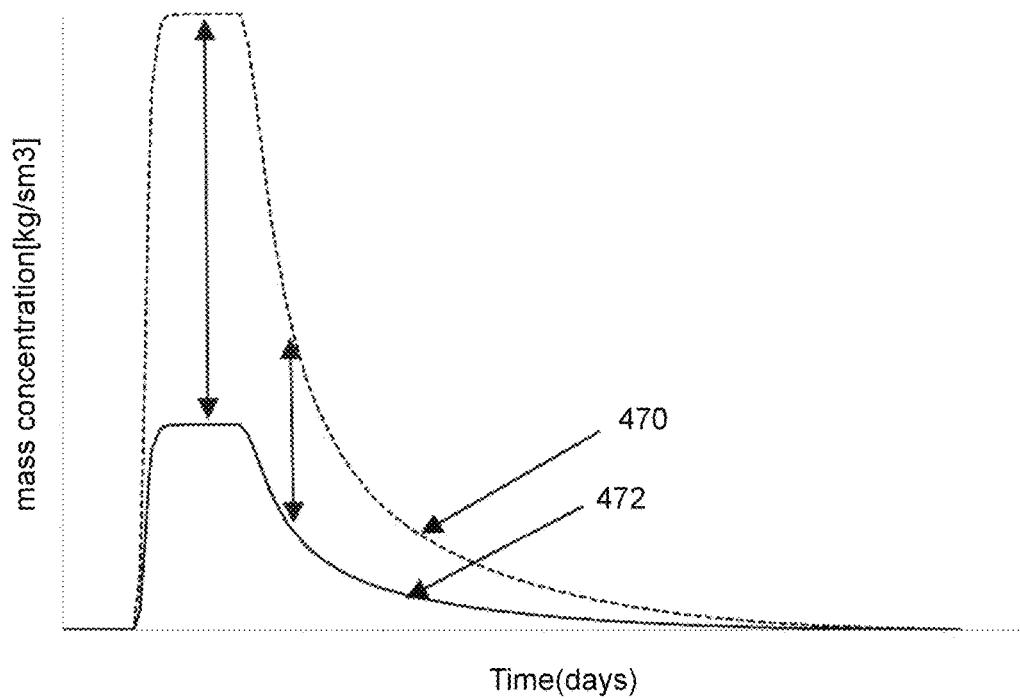
FIG. 13 illustrates example concentration profiles for neutral and polymer components, with transport coefficients used.

Next, with reference to FIG. 8B, it will be appreciated that the degree of viscous fingering may depend on actual polymer concentration and the transport coefficient function itself may be dependent on the concentration of injected polymer. To address this issue, the following observation can be used: if two components of different concentrations are moving at the same speeds (which is generally the case with the polymer and neutral components shown above), the ratio of their concentrations will generally be constant. This holds true both for cases when no transport coefficients are used, or if they are used as in the example above. FIG. 13, in particular, illustrates concentration profiles of neutral (profile 470) and polymer (profile 472) components. It will also be appreciated that this ratio also relays information on the polymer slug size relative to the neutral component, and can be used in some embodiments to determine which transport coefficient function should be used for that particular ratio.

Figure 11:
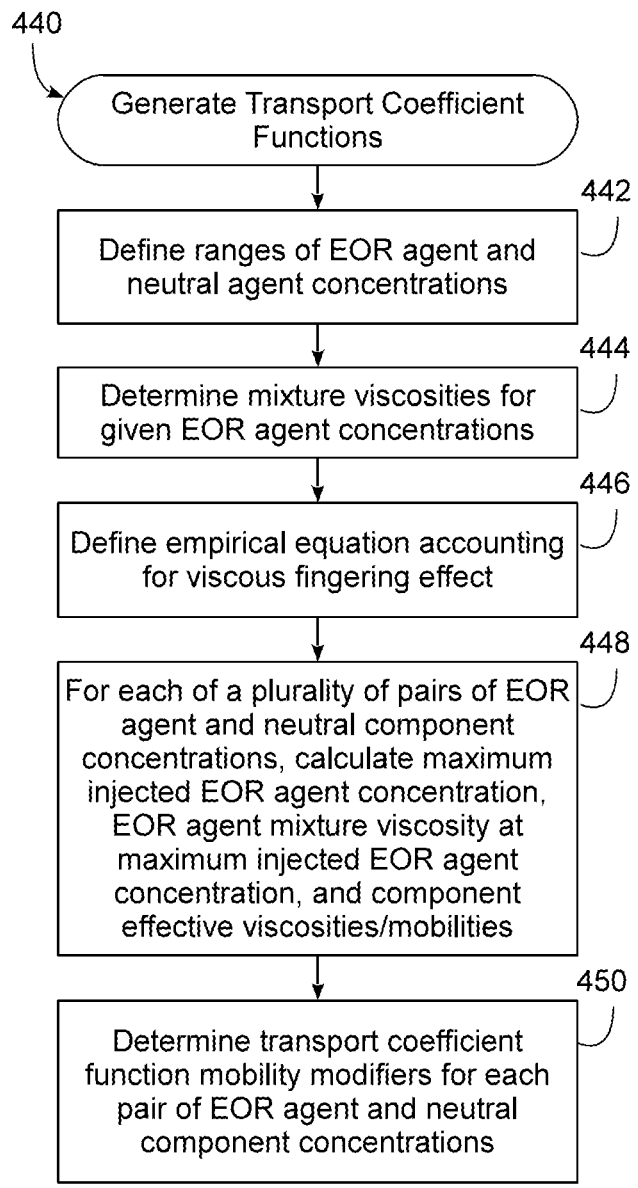
FIG. 11 is a flowchart illustrating an example sequence of operations for generating two dimensional transport coefficient functions in the data processing system of FIG. 1.

This effect can be captured in some embodiments using a two-dimensional transport coefficient function in the form, for example, of a table, where each table cell includes a mobility modifier and is indexed using both neutral component and polymer component concentrations. In other embodiments, the mixing calculations may be used internally to determine a mobility multiplier for each component depending on pair of these concentrations. This is illustrated by sequence of operations 440 of FIG. 11. Sequence of operations 440 may be implemented, for example, within a reservoir simulator or externally thereto. In some embodiments, for example, and as illustrated beginning at block 442, a two-dimensional transport coefficient may be generated by first defining a range of polymer concentrations from 0 until injected concentration of the highest concentration slug. Similarly, define a range of neutral component concentrations from 0 until neutral component injection concentration (which is constant for all polymer slugs) may also be defined. Next, in block 444, mixture viscosities for given polymer concentrations may be determined using a polymer solution viscosity vs polymer concentration function ($\mu_m(C_p)$). Next, in block 446, an empirical equation accounting for viscous fingering effect can be defined, e.g., using the Todd-Longstaff equation, its variations or other equations. Then, in block 448, for each given pair of polymer and neutral component concentrations, a maximum injected polymer concentration $C_{pmax}$ may be calculated, e.g., using a relationship $$\frac{C_{neut}}{C_{neutmax}} = \frac{C_p}{C_{pmax}} \text{ or } C_{pmax} = C_p \frac{C_{neutmax}}{C_{neut}}.$$

In addition, empirical constants (for example, ω) may be specified, and any additional input, e.g., viscosity at zero polymer concentration, may also be specified or determined in block 448. Furthermore, in block 448 polymer mixture viscosity ($\mu_p = \mu_m(C_p = C_{pmax})$) at injected polymer concentration $C_{pmax}$ and effective viscosities (or mobilities, depending on the equation selected in step block 446) for each given pair of polymer and neutral component concentrations may be calculated. In case of using the Todd-Longstaff equations, for example, such calculations may use Eqs. (3)-(6) discussed above. Next, in block 460, transport coefficient functions may be determined for each pair of EOR agent and neutral component concentrations, e.g., using Eqs. (7)-(8).

Figure 14:
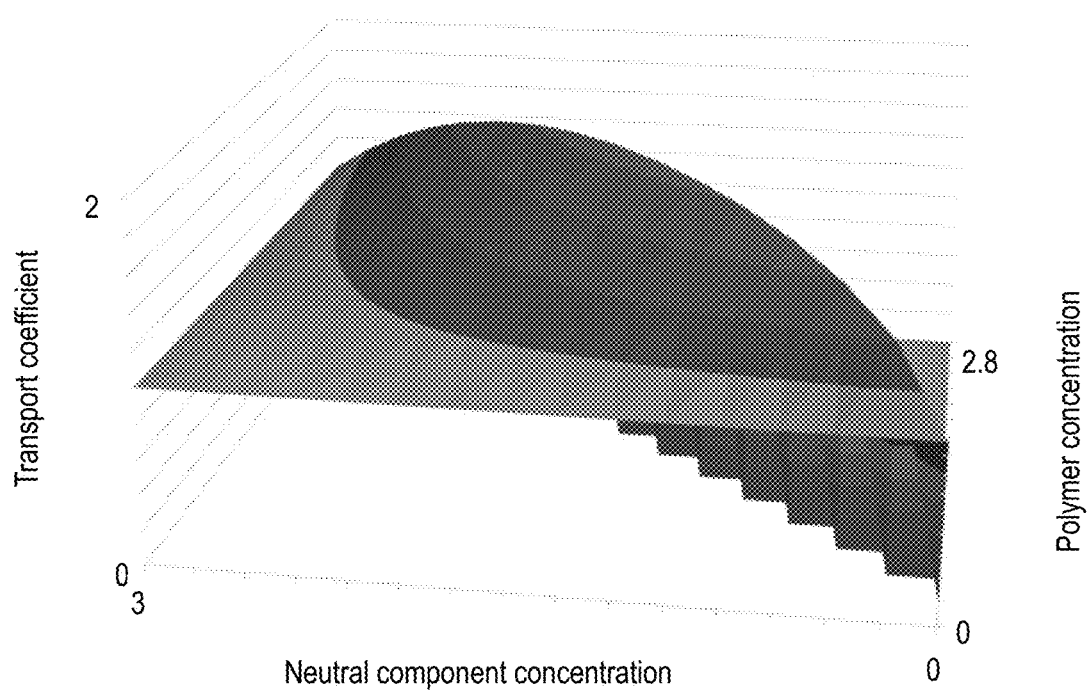
FIG. 14 illustrates a two dimensional transport coefficient surface for a water component.
Figure 15:
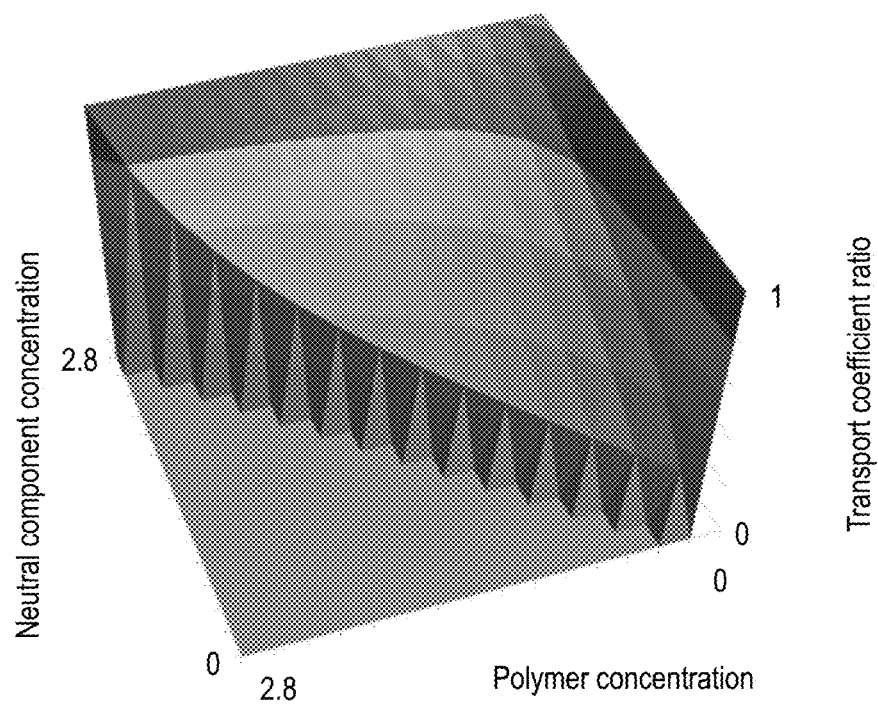
FIG. 15 illustrates a two dimensional transport coefficient surface a ratio of polymer to water transport coefficients.

FIGS. 14 and 15 illustrate example visualizations of a two-dimensional table. FIG. 14, for example, represents a 2D transport coefficient surface for a water component as a function of both neutral component and polymer concentration, and it will be appreciated that a similar surface may be defined for a polymer component. FIG. 15, in turn, illustrates 2D transport coefficient surface for the ratio of polymer to water transport coefficients, and it can be seen from both figures that these surfaces are generally smooth and thus suitable for implementation in a reservoir simulator.

Eq. (13) allows parameterization of the effects of different polymer concentration slugs arriving in the same simulation grid cell through the use of the two parameter transport coefficient method discussed above. For more detailed description of mixing of multiple polymer slugs, multiple neutral components may be used.

The aforementioned approach may provide a relatively small number of tracked components, thus minimally impacting simulation performance, and may also be implemented in a number of commercially-available reservoir simulators without substantially re-engineering for polymer injection modelling. Other advantages will be apparent to those of ordinary skill in the art having the benefit of the instant disclosure.

Injection Concentration-Dependent EOR Agent Components

As noted above, another approach that may be used to modify fluid mobility in a grid block is that of injection concentration-dependent EOR agent components. In particular, in some embodiments, different slugs at different EOR agents may be treated as different polymer solutions, and thus may be represented using separately tracked polymer components. The viscosity of each component may be calculated separately using its own mixing equation:

$$\mu_{w,\mathit{eff}} = \mu_w^{1-\omega}\ \mu_m^{\omega} \qquad (17)$$

$$\mu_{p1\mathit{eff}} = \mu_{p1}^{1-\omega}\ \mu_m^{\omega}$$

$$\mu_{p2\mathit{eff}} = \mu_{p2}^{1-\omega}\ \mu_m^{\omega}$$

$$\ldots$$

$$\mu_{pn\mathit{eff}} = \mu_{pn}^{1-\omega}\ \mu_m^{\omega}$$

and the total flow of the aqueous phase may be constituted from flows of pure water phase and different polymer solutions:

$$q_{aq} = q_w + q_{p1} + q_{p2} + \ldots + q_{pn} \qquad (18)$$

If the equation above is expanded using Darcy's law, and all the same terms cancelled in both parts of the equation, the following results:

$$\frac{1}{\mu_{aq,\mathit{eff}}} = \frac{S_w}{S_{aq}}\frac{1}{\mu_{w,\mathit{eff}}} + \frac{S_{p1}}{S_{aq}}\frac{1}{\mu_{p1,\mathit{eff}}} + \frac{S_{pn}}{S_{aq}}\frac{1}{\mu_{pn,\mathit{eff}}} \qquad (19)$$

As it can be seen from the equation above, apart from effective viscosity of the each phase, the fraction of each phase (water, polymer 1, polymer 2, etc.) within the aqueous phase may need to be determined. For each polymer component it can be expressed as:

$$\frac{S_{pi}}{S_{aq}} = \frac{C_{pi}}{C_{pimax}} \qquad (20)$$

After all polymer phase fractions are known, the pure water phase fraction may be computed as:

$$\frac{S_w}{S_{aq}} = 1 - \sum_{i=1}^{N}\frac{C_{pi}}{C_{pimax}} \qquad (21)$$

Additionally in both cases logic on how different polymer species modify the properties of the aqueous phase and reservoir rock may be defined and implemented (e.g., polymer concentration/saturation—viscosity function, shear rate, adsorption calculations, etc.).

Figure 16:
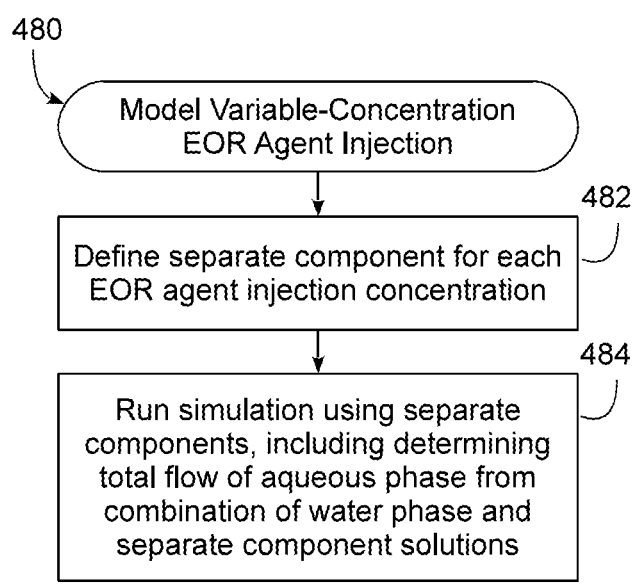
FIG. 16 is a flowchart illustrating an example sequence of operations for modeling a variable-concentration EOR agent injection using separate injection concentration-dependent components in the data processing system of FIG. 1.

FIG. 16, for example, illustrates a sequence of operations 480 for modeling a variable-concentration injection of EOR agent in accordance with this latter technique. As shown in block 482, each EOR agent injection concentration may be defined as a separate component. Then, in block 484 a simulation may be run using the separate components, including determining the total flow of the aqueous phase from the combination of the water phase and the separate component solutions.

Although the preceding description has been described herein with reference to particular means, materials, and embodiments, it is not intended to be limited to the particular disclosed herein. By way of further example, embodiments may be utilized in conjunction with a handheld system (i.e., a phone, wrist or forearm mounted computer, tablet, or other handheld device), portable system (i.e., a laptop or portable computing system), a fixed computing system (i.e., a desktop, server, cluster, or high performance computing system), or across a network (i.e., a cloud-based system). As such, embodiments extend to all functionally equivalent structures, methods, uses, program products, and compositions as are within the scope of the appended claims. In addition, while particular embodiments have been described, it is not intended that the invention be limited thereto, as it is intended that the invention be as broad in scope as the art will allow and that the specification be read likewise. It will therefore be appreciated by those skilled in the art that yet other modifications could be made without deviating from its spirit and scope as claimed.

What is claimed is:

1. A method of modeling an Enhanced Oil Recovery (EOR) process in a subsurface volume, the method comprising:
    computer modeling a variable-concentration injection of an EOR agent in a plurality of grid blocks of a reservoir grid, the variable-concentration injection including an injection of the EOR agent at a plurality of injection concentrations;
    for a first grid block among the plurality of grid blocks within which EOR agent is present, computer modeling a viscous fingering effect within the first grid block by modifying a fluid mobility in the first grid block based at least in part upon the injection concentration of the EOR agent present in the first grid block;
    running a computer simulation using the computer modeling of the variable-concentration injection of the EOR agent and the computer modeling of the viscous fingering effect; and
    refining the EOR process based at least in part upon a result of the computer simulation.

2. The method of claim 1, wherein the EOR agent present in the first grid block is injected at a first injection concentration among the plurality of injection concentrations, and wherein modifying the fluid mobility in the first grid block based at least in part upon the injection concentration of the EOR agent present in the first grid block includes computing an effective mobility or an effective viscosity of the EOR agent present in the first grid block based at least in part on the first injection concentration.

3. The method of claim 2, wherein the first grid block additionally includes EOR agent injected at a second injection concentration among the plurality of injection concentrations, and wherein computer modeling the viscous fingering effect within the first grid block further modifies the fluid mobility in the first grid block based at least in part upon the second injection concentration.

4. The method of claim 2, wherein computing the effective mobility or effective viscosity of the EOR agent disposed in the first grid block is performed for a first time period during which the EOR agent injected at the first injection concentration is disposed in the first grid block, wherein computer modeling the viscous fingering effect includes computing a second effective mobility or a second effective viscosity of EOR agent disposed in the first grid block at the second time period and injected at a second injection concentration among the plurality of injection concentrations, and wherein computing the second effective mobility or the second effective viscosity of the EOR agent disposed in the first grid block at the second time period includes computing the second effective mobility or the second effective viscosity using the second injection concentration.

5. The method of claim 1, further comprising computer modeling the viscous fingering effect within at least a subset of the plurality of grid blocks within which EOR agent injected at the plurality of injection concentrations is present by modifying a fluid mobility in each of the at least a subset of the plurality of grid blocks based at least in part upon at which among the plurality of injection concentrations EOR agent present in such grid block has been injected.

6. The method of claim 5, wherein the variable-concentration injection forms a plurality of EOR agent slugs having differing injection concentrations, wherein computer modeling the variable-concentration injection in the plurality of grid blocks concurrently models the plurality of EOR agent slugs, and wherein computer modeling the viscous fingering effect within the at least a subset of the plurality of grid blocks concurrently models the viscous fingering effect for each of the plurality of EOR agent slugs.

7. The method of claim 1, wherein the EOR agent comprises polymer.

8. The method of claim 1, wherein the plurality of grid blocks are defined at a spatial resolution that is insufficient to accurately model viscous fingers.

9. The method of claim 1, further comprising computer modeling the viscous fingering effect within at least a subset of the plurality of grid blocks within which EOR agent injected at the plurality of injection concentrations is present by applying a transport coefficient function to enable fluid mobility in each of the at least a subset of the plurality of grid blocks to be calculated for any of the plurality of injection concentrations.

10. The method of claim 9, wherein the transport coefficient function is a function of a concentration of EOR agent present in a grid block, and wherein applying the transport coefficient function includes applying the transport coefficient function for the first grid block based upon a concentration of EOR agent present in the first grid block.

11. The method of claim 10, wherein computer modeling the variable-concentration injection of the EOR agent in the plurality of grid blocks further includes computer modeling a constant injection of a neutral component, wherein the transport coefficient function is additionally a function of a concentration of the neutral component present in a grid block, and wherein applying the transport coefficient function further includes applying the transport coefficient function for the first grid block based upon a concentration of neutral component present in the first grid block.

12. The method of claim 11, further comprising generating the transport coefficient function by determining a mobility modifier over a range of EOR agent concentrations and over a range of neutral component concentrations.

13. The method of claim 12, wherein the transport coefficient function is implemented using a two-dimensional lookup table having first and second inputs respectively based on neutral component concentration and EOR agent concentration.

14. The method of claim 12, wherein computer modeling the viscous fingering effect within the first grid block includes computing a mobility modifier for the EOR agent using the transport coefficient function.

15. The method of claim 14, further comprising computing an effective mobility of a water component disposed in the first grid block using the transport coefficient function.

16. The method of claim 9, further comprising generating the transport coefficient function by determining a mobility modifier over a range of EOR agent concentrations and over a range of EOR agent injection concentrations.

17. The method of claim 1, wherein computer modeling the variable-concentration of the EOR agent includes computer modeling the variable-concentration injection of the EOR agent using a plurality of EOR agent components respectively modeling the EOR agent at respective injection concentrations among the plurality of injection concentrations, wherein the plurality of EOR agent components includes a first EOR agent component corresponding to the EOR agent injected at the first injection concentration, and wherein computer modeling the viscous fingering effect within the first grid block includes using the injection concentration of the EOR agent as a maximum concentration in a calculation of effective viscosity or effective mobility for the first EOR agent component.

18. The method of claim 17, wherein the plurality of EOR agent components includes a second EOR agent component corresponding to the EOR agent injected at a second injection concentration among the plurality of injection concentrations, and wherein the method further includes using the second injection concentration of the EOR agent as a maximum concentration in a calculation of effective viscosity or effective mobility for the second EOR agent component.

19. An apparatus, comprising:
at least one processing unit; and
program code configured upon execution by the at least one processing unit to model an Enhanced Oil Recovery (EOR) process in a subsurface volume by:
  computer modeling a variable-concentration injection of an EOR agent in a plurality of grid blocks of a reservoir grid, the variable-concentration injection including an injection of the EOR agent at a plurality of injection concentrations;
  for a first grid block among the plurality of grid blocks within which EOR agent is present, computer modeling a viscous fingering effect within the first grid block by modifying a fluid mobility in the first grid block based at least in part upon the injection concentration of the EOR agent present in the first grid block;
  running a computer simulation using the computer modeling of the variable-concentration injection of the EOR agent and the computer modeling of the viscous fingering effect; and
  refining the EOR process based at least in part upon a result of the computer simulation.

20. A program product, comprising:
a non-transitory computer readable medium; and
program code stored on the computer readable medium and configured upon execution by at least one processing unit to model an Enhanced Oil Recovery (EOR) process in a subsurface volume by:
  computer modeling a variable-concentration injection of an EOR agent in a plurality of grid blocks of a reservoir grid, the variable-concentration injection including an injection of the EOR agent at a plurality of injection concentrations;
  for a first grid block among the plurality of grid blocks within which EOR agent is present, computer modeling a viscous fingering effect within the first grid block by modifying a fluid mobility in the first grid block based at least in part upon the injection concentration of the EOR agent present in the first grid block;
  running a computer simulation using the computer modeling of the variable-concentration injection of the EOR agent and the computer modeling of the viscous fingering effect; and refining the EOR process based at least in part upon a result of the computer simulation.

\* \* \* \* \*